US011406005B2

United States Patent
Kitazumi

(10) Patent No.: US 11,406,005 B2
(45) Date of Patent: Aug. 2, 2022

(54) SUBSTRATE FOR MOUNTING ELECTRONIC ELEMENT, ELECTRONIC DEVICE, AND ELECTRONIC MODULE

(71) Applicant: KYOCERA Corporation, Kyoto (JP)

(72) Inventor: Noboru Kitazumi, Kyoto (JP)

(73) Assignee: KYOCERA CORPORATION, Kyoto (JP)

(*) Notice: Subject to any disclaimer, the term of this patent is extended or adjusted under 35 U.S.C. 154(b) by 0 days.

(21) Appl. No.: 17/058,162

(22) PCT Filed: May 29, 2019

(86) PCT No.: PCT/JP2019/021357
§ 371 (c)(1),
(2) Date: Nov. 24, 2020

(87) PCT Pub. No.: WO2019/230826
PCT Pub. Date: Dec. 5, 2019

(65) Prior Publication Data
US 2021/0219416 A1   Jul. 15, 2021

(30) Foreign Application Priority Data

May 29, 2018 (JP) .............................. JP2018-102483

(51) Int. Cl.
*H05K 1/02* (2006.01)
*H05K 1/03* (2006.01)
(Continued)

(52) U.S. Cl.
CPC ....... *H05K 1/0204* (2013.01); *H01L 23/3735* (2013.01); *H05K 1/0271* (2013.01);
(Continued)

(58) Field of Classification Search
CPC ............. H05K 7/2039; H05K 7/20454; H05K 7/20463; H05K 7/20472; H05K 7/205;
(Continued)

(56) References Cited

U.S. PATENT DOCUMENTS 4,835,783 A * 5/1989 Suyama ................. B82Y 20/00
                                                   372/45.01
5,494,753 A    2/1996 Anthony
(Continued)

FOREIGN PATENT DOCUMENTS

CN    111264088 A  *  6/2020  ............. H05K 1/038
EP    2458638 A1  *  5/2012  ....... H01L 27/14618
(Continued)

OTHER PUBLICATIONS

English translation of JP 2012238733 (Year: 2012).*

*Primary Examiner* — Jayprakash N Gandhi
*Assistant Examiner* — Amir A Jalali
(74) *Attorney, Agent, or Firm* — Volpe Koenig

(57) ABSTRACT

A substrate for mounting electronic element includes: a first substrate including a first surface and a second surface opposed thereto, the first substrate being made of an insulating material; a second substrate made of a carbon material; at least one surface metal layer located on the first surface, including at least one mounting portion for at least one electronic element; and a bonding metal layer on the second surface. Heat conduction of the second substrate in a direction perpendicular to a longitudinal direction of the at least one mounting portion is greater than heat conduction of the second substrate in the longitudinal direction of the at least one mounting portion, and a width of the bonding metal layer is greater than or equal to a maximum width of the at
(Continued)

least one surface metal layer in a direction perpendicular to the longitudinal direction of the at least one mounting portion.

11 Claims, 21 Drawing Sheets

(51) Int. Cl.
    *H01L 23/373* (2006.01)
    *H01S 5/0237* (2021.01)
    *H01S 5/02345* (2021.01)

(52) U.S. Cl.
    CPC .......... *H05K 1/0306* (2013.01); *H01S 5/0237* (2021.01); *H01S 5/02345* (2021.01); *H05K 2201/10121* (2013.01); *H05K 2201/10151* (2013.01)

(58) Field of Classification Search
    CPC ........ H05K 7/2089–209; H05K 1/0201–0212; H05K 1/021; H05K 1/029; H05K 1/0271; H05K 1/0306; H05K 2201/06–068; H05K 2201/10121; H05K 2201/10151; H05K 2201/10416; H01S 5/0237; H01S 5/02345; H01S 5/0206; H01S 5/022; H01S 5/02469; H01L 33/64; H01L 33/48; H01L 33/12; H01L 33/36; H01L 33/49833; H01L 33/024
    See application file for complete search history.

(56) References Cited

U.S. PATENT DOCUMENTS

| | | | |
|---|---|---|---|
| 6,480,389 B1* | 11/2002 | Shie | H01L 33/58 257/E33.073 |
| 2004/0144561 A1* | 7/2004 | Osanai | H01L 23/13 174/252 |
| 2006/0124835 A1* | 6/2006 | Kiyomoto | F21V 7/0091 250/216 |
| 2010/0044741 A1* | 2/2010 | Okimura | F21V 19/0055 257/99 |
| 2011/0014417 A1* | 1/2011 | Lemak | H01L 23/4006 428/99 |
| 2012/0097945 A1* | 4/2012 | Wen | H01L 33/641 257/49 |
| 2013/0328184 A1* | 12/2013 | Iwayama | C04B 41/515 257/712 |
| 2014/0252601 A1* | 9/2014 | Lu | H01L 23/5329 257/737 |
| 2016/0079195 A1* | 3/2016 | Tanaka | H01L 24/09 257/737 |
| 2018/0072019 A1* | 3/2018 | Shimoji | C23C 14/562 |
| 2018/0145020 A1* | 5/2018 | Kohda | H01L 24/40 |
| 2018/0153030 A1* | 5/2018 | Viswanathan | H05K 1/0203 |
| 2020/0144185 A1* | 5/2020 | Lu | H01L 25/0657 |

FOREIGN PATENT DOCUMENTS

| | | | | |
|---|---|---|---|---|
| EP | 3561865 A1 | 10/2019 | | |
| EP | 3748671 A1 | 12/2020 | | |
| JP | 08-191121 A | 7/1996 | | |
| JP | 10-256442 A | 9/1998 | | |
| JP | 2000-200865 A | 7/2000 | | |
| JP | 2012-160548 A | 8/2012 | | |
| JP | 2012-238733 A | 12/2012 | | |
| JP | 2012238733 A | * | 12/2012 | |
| JP | 2013-175508 A | 9/2013 | | |
| JP | 2015-191950 A | 11/2015 | | |
| WO | WO-2006132150 A1 | * | 12/2006 | .......... H01L 33/641 |
| WO | WO-2012087014 A2 | * | 6/2012 | ................ G02B 6/43 |
| WO | WO-2013121773 A1 | * | 8/2013 | .......... H05K 1/0313 |
| WO | WO-2015137109 A1 | * | 9/2015 | ......... H01L 23/3672 |
| WO | WO-2016009741 A1 | * | 1/2016 | ............. H01L 25/07 |

\* cited by examiner

SUBSTRATE FOR MOUNTING ELECTRONIC ELEMENT, ELECTRONIC DEVICE, AND ELECTRONIC MODULE

CROSS-REFERENCE TO RELATED APPLICATIONS

This application is a national stage entry according to 35 U.S.C. 371 of International Application No. PCT/JP2019/021357 filed on May 29, 2019, which claims priority to Japanese Patent Application No. 2018-102483 filed on May 29, 2018, the contents of which are entirely incorporated herein by reference.

TECHNICAL FIELD

The present disclosure relates to a substrate for mounting electronic element, an electronic device, and an electronic module.

BACKGROUND

In the related art, a substrate for mounting electronic element includes: an insulating substrate including a first principal surface, a second principal surface, and side faces; and an electronic element mounting portion and a wiring layer which are located on the first principal surface of the insulating substrate. After mounting an electronic element on the electronic element mounting portion of the substrate for mounting electronic element, the substrate for mounting electronic element is mounted on a package for housing electronic element to construct an electronic device (refer to Japanese Unexamined Patent Publication JP-A 2013-175508).

SUMMARY

A substrate for mounting electronic element according to the disclosure includes: a first substrate including a first surface and a second surface, the first substrate being made of an insulating material; a second substrate including a third surface and a fourth surface opposed to the third surface, the second substrate being made of a carbon material; at least one surface metal layer located on the first surface, the at least one surface metal layer including at least one mounting portion for at least one electronic element; and a bonding metal layer located on the second surface, in a transparent plan view of the substrate for mounting electronic element, the at least one mounting portion is rectangular in shape, the third surface being connected to at least the second surface at position overlapped with the at least one mounting portion in the transparent plan view of the substrate for mounting electronic element, heat conduction of the second substrate in a direction perpendicular to a longitudinal direction of the at least one mounting portion being greater than heat conduction of the second substrate in the longitudinal direction of the at least one mounting portion, a width of the bonding metal layer being greater than or equal to a maximum width of the at least one surface metal layer in a direction perpendicular to the longitudinal direction of the at least one mounting portion.

An electronic device according to the disclosure includes: the substrate for mounting electronic element described above; at least one electronic element mounted on the at least one mounting portion of the substrate for mounting electronic element; and a wiring substrate or a package for housing electronic element on which the substrate for mounting electronic element is mounted.

An electronic module according to the disclosure includes: the electronic device described above; and a module substrate to which the electronic device is connected.

DETAILED DESCRIPTION

Figure 1A:
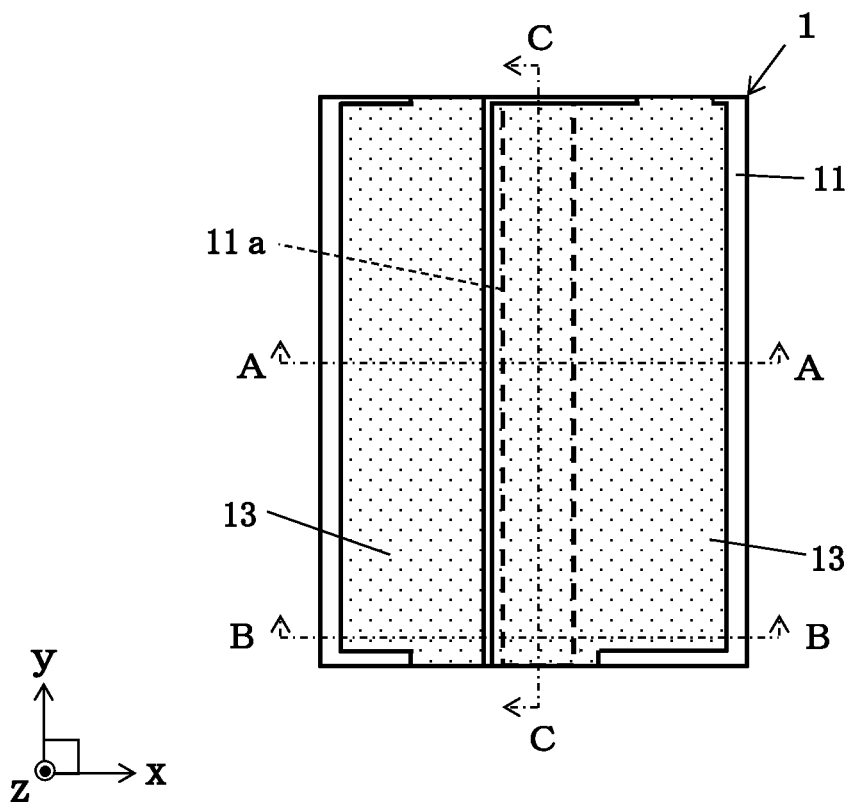
FIG. 1A is a top plan view showing a substrate for mounting electronic element according to a first embodiment.
Figure 1B:
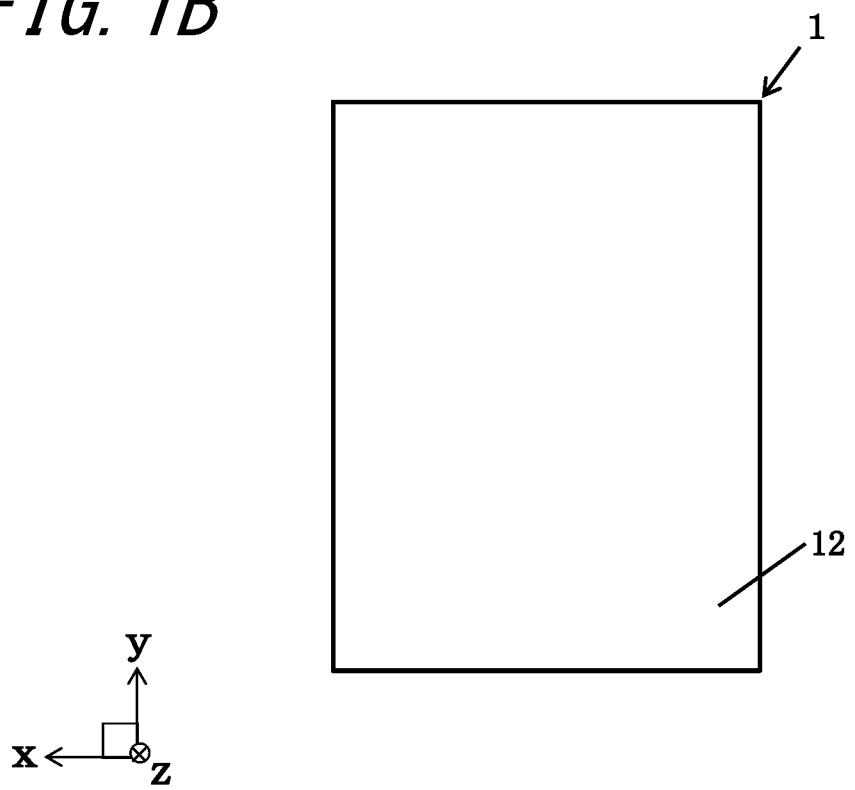
FIG. 1B is a bottom plan view of the substrate shown in FIG. 1A.

Several exemplary embodiments of the disclosure will now be described with reference to the accompanying drawings.

First Embodiment

As in an example shown in FIGS. 1A to 5B, an 5, a substrate for mounting electronic element 1 according to a first embodiment of the disclosure includes a first substrate 11 and a second substrate 12. An electronic device includes the substrate for mounting electronic element 1, an electronic element 2 mounted on a mounting portion 11a of the substrate for mounting electronic element 1, and a wiring substrate on which the substrate for mounting electronic element 1 is mounted. For example, the electronic device is connected to a connection pad disposed on a module substrate constituting an electronic module with a joining material.

The substrate for mounting electronic element 1 according to this embodiment includes: the first substrate 11 which includes a first principal surface, is made of an insulating material, and is quadrangular in shape; a surface metal layer 13 which is located on the first principal surface, and includes a mounting portion 11a for the electronic element 2 which is rectangular in shape; and the second substrate 12 which is located on a second principal surface opposed to the first principal surface, is made of a carbon material, and includes a third principal surface facing the second principal surface and a fourth principal surface opposed to the third principal surface, and a bonding metal layer 14 is located on the second principal surface. In a transparent plan view, heat conduction of the second substrate 12 in a direction perpendicular to a longitudinal direction of the mounting portion 11a is greater than heat conduction of the second substrate 12 in the longitudinal direction of the mounting portion 11a, and a width dimension of the bonding metal layer 14 is greater than or equal to a width dimension of the surface metal layer 13 in a direction perpendicular to the longitudinal direction of the mounting portion 11a. In FIGS. 1A to 5B, the electronic element 2 is shown as mounted on an x-y plane in an imaginary x-y-z space. In FIGS. 1A to 5B, an upward direction conforms to a positive direction along an imaginary z axis. In the following description, the terms "upper" and "lower" are used for purposes of convenience and are not intended to be limiting of the oriented positions of the substrate for mounting electronic element 1, etc. in a vertical direction when in use.

In the example shown in FIG. 1A, the surface metal layer 13 is indicated by a dot-shaded area.

The first substrate 11 includes the first principal surface (upper surface as viewed in FIGS. 1A to 4) and the second principal surface (lower surface as viewed in FIGS. 1A to 4). The first principal surface and the second principal surface are opposed to each other. The first substrate 11 includes a single or a plurality of insulating layers, and is shaped in a quadrangular plate having two pairs of opposite sides (four sides in total) positioned in relation to each of the first principal surface and the second principal surface, in a plan view. The first substrate 11 serves as a support for supporting the rectangular electronic element 2, and the electronic element 2 is fixedly adhered via a joining material such as a Au—Sn material onto the rectangular mounting portion 11a located on the first principal surface of the first substrate 11.

For example, the first substrate 11 may be formed of ceramics such as an aluminum oxide sintered body (alumina ceramics), an aluminum nitride sintered body, a mullite sintered body, and a glass ceramics sintered body. For example, in the case where an aluminum nitride sintered body is used for the first substrate 11, a slurry is prepared by admixing suitable organic binder, solvent, etc. in powdery raw materials such as aluminum nitride (AlN), erbium oxide ($Er_2O_3$), yttrium oxide ($Y_2O_3$), etc. The resulting slurry is shaped into a sheet by heretofore known means such as a doctor blade method or a calendar roll method, thereby forming a ceramic green sheet. On an as needed basis, a plurality of ceramic green sheets are stacked into a laminate, and the ceramic green sheet or the laminate is fired at a high temperature (about 1800° C.). In this way, the first substrate 11 including a single or a plurality of insulating layers is produced.

The second substrate 12 includes the third principal surface (upper surface as viewed in FIGS. 1A to 4) and the fourth principal surface (lower surface as viewed in FIGS. 1A to 4). The third principal surface and the fourth principal surface are opposed to each other.

For example, the second substrate 12 is made of a carbon material in the form of a graphene laminate structure containing six-membered rings joined together by covalent bonds, in which lamination planes are bound together by van der Waals' forces.

The surface metal layer 13 is located on the first principal surface of the first substrate 11. The surface metal layer 13 is used as a connecting portion for the mounting portion 11a of the electronic element 2 or a connecting member 3 such as a bonding wire, and serves to provide electrical connection between the electronic element 2 and a wiring conductor of the wiring substrate.

The surface metal layer 13 includes a thin-film layer 13a and a plating layer 13b. For example, the thin-film layer 13a includes a metallic adherent layer 13a1 and a barrier layer 13a2. The adherent metal layer constituting the thin-film layer is formed on the first principal surface of the first substrate 11. The adherent metal layer is formed of, for example, tantalum nitride, a nickel-chromium material, a nickel-chromium-silicon material, a tungsten-silicon material, a molybdenum-silicon material, tungsten, molybdenum, titanium, and chromium, and is deposited on the first principal surface of the first substrate 11 by using a thin-film forming technique such as vapor deposition, ion plating, or sputtering. For example, in the case where vacuum deposition is adopted, the first substrate 11 is set in a film-forming chamber of a vacuum evaporator, and a metal piece for constituting the adherent metal layer is placed at an evaporation source within the film-forming chamber. After that, the interior of the film-forming chamber is vacuumed (under a pressure of 10-2 Pa or below), and the metal piece placed at the evaporation source is evaporated under heat, so that the molecules of the evaporated metal piece can be deposited onto the first substrate 11. Thus, a layer of a thin metal film for constituting the adherent metal layer is formed. The first substrate 11 provided with the thin metal film layer is subjected to a resist pattern-forming process using photolithography. After that, an excess of the thin metal film layer is removed by etching. In this way, the adherent metal layer is formed. The resulting adherent metal layer is deposited at its upper surface with a barrier layer. The barrier layer exhibits good adherability and wettability to the adherent metal layer and the plating layer, and thus serves to join the adherent metal layer with the plating layer firmly, as well as to prevent mutual diffusion of the adherent metal layer and the plating layer. For example, the barrier layer is formed of a nickel-chromium material, platinum, palladium, nickel, or cobalt. The barrier layer is deposited on the surface of the adherent metal layer by a thin-film forming technique such as vapor deposition, ion plating, or sputtering.

The adherent metal layer preferably has a thickness of about 0.01 μm to 0.5 μm. In the case where the thickness is less than 0.01 μm, it tends to difficult to firmly adhere the adherent metal layer on the first substrate 11. In the case where the thickness exceeds 0.5 μm, separation of the adherent metal layer is likely to occur due to an internal stress during film formation of the adherent metal layer. Moreover, the barrier layer preferably has a thickness of about 0.05 μm to 1 μm. In the case where the thickness is less than 0.05 μm, defects such as pinholes occur, which may impair barrier layer effects. In the case where the thickness exceeds 1 μm, separation of the barrier layer is likely to occur due to an internal stress during film formation of the barrier layer.

The plating layer is deposited on the exposed surface of the thin-film layer by electrolytic plating or electroless plating. The plating layer is formed of metal which is highly resistant to corrosion and affords high connectability to the connecting member, such as nickel, copper, gold, or silver. For example, the exposed surface is deposited successively with a nickel plating layer having a thickness of about 0.5 μm to 5 μm and a gold plating layer having a thickness of about 0.1 μm to 3 μm. This can retard corrosion of the surface metal layer 13 effectively, and also can strengthen the connection between the surface metal layer 13 and the wiring conductor formed in the wiring substrate.

Moreover, a layer of metal such as copper (Cu) or gold (Au) may be placed on the barrier layer in the interest of successful formation of the plating layer. The above-described metal layer is formed in a similar manner to that for forming the thin-film layer.

The bonding metal layer 14 may be formed in a similar manner to that for forming the surface metal layer 13 as described above (i.e. including a thin film layer 14a comprising a metallic adherent layer 14a1 and a barrier layer 14a2 and a plating layer 14b). In the case where the bonding metal layer 14 is formed of the above-described thin-film layer 14a, the bonding metal layer 14, which is joined to the second substrate 12 via a joining material 15 as will hereafter be described, is formed of a highly heat-resistant metal layer.

The width of the bonding metal layer 14 is greater than or equal to the width of the surface metal layer 13 in a direction perpendicular to the longitudinal direction of the mounting portion 11a. That is, as in the case shown in FIGS. 3A to 3C, the bonding metal layer 14 is, at its region where the mounting portion 11a is disposed, greater than or equal to the surface metal layer 13 in width in a direction perpendicular to the longitudinal direction of the mounting portion 11a (W21≥W11, and W22≥W12).

For the first substrate 11, an aluminum nitride sintered body is preferably used which excels in thermal conductivity. The first substrate 11 and the second substrate 12 are joined together by bonding the bonding metal layer 14 located on the second principal surface of the first substrate 11 to the third principal surface of the second substrate 12 via the joining material 15 formed of an active brazing filler metal such as a Ti—Cu—Ag alloy or a Ti—Sn—Ag—Cu alloy, for example. The joining material, which is about 10 μm thick, is interposed between the first substrate 11 and the second substrate 12.

The first substrate 11 is quadrangular in plan configuration. The second substrate 12 is quadrangular in plan configuration. The first substrate 11 and the second substrate are bonded together to form a quadrangular composite substrate. Note that the "quadrangular" configuration means the shape of a quadrilateral such as a square and a rectangle. In the example shown in FIGS. 1A to 4, the first substrate 11 and the second substrate 12 are each rectangular in plan configuration. Thus, the rectangular composite substrate is formed.

For example, the first substrate 11 has a substrate thickness T1 of about 50 μm to 500 μm, whereas the second substrate 12 has a substrate thickness T2 of about 100 μm to 2000 μm. If the relation between the first substrate 11 and the second substrate 12 given by: T2>T1 is fulfilled, heat from the first substrate 11 can be satisfactorily dissipated to the second substrate 12.

After the composite substrate is produced by joining the first substrate 11 and the second substrate 12 together with the joining material 15, the surface metal layer 13 is provided on the first principal surface of the first substrate 11. In this way, the substrate for mounting electronic element 1 is formed.

Figure 2:
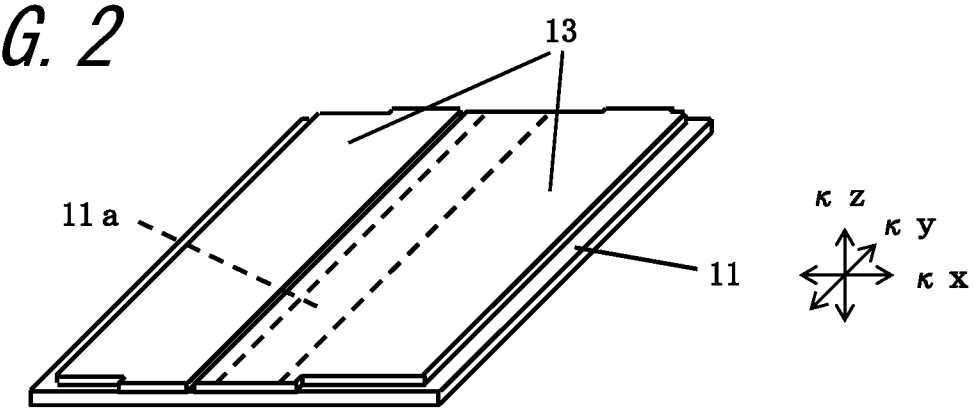
FIG. 2 is a perspective view showing a first substrate and a second substrate of the substrate for mounting electronic element shown in FIGS. 1A and 1B in a disassembled state.
Figure 2:
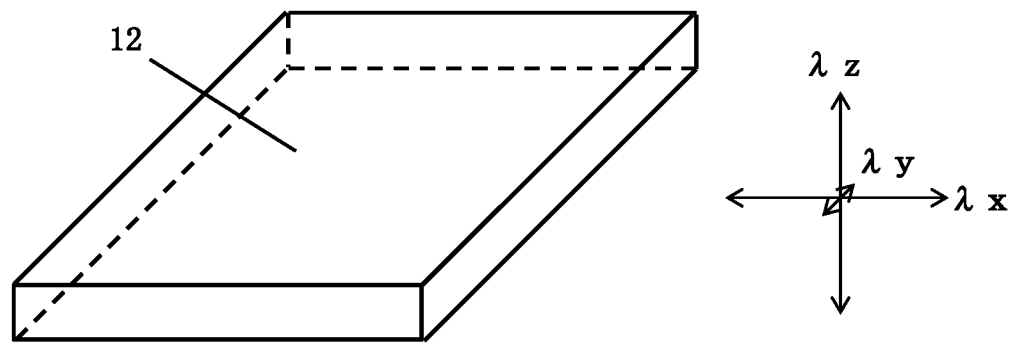
Figure 2:
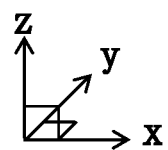

As in the example shown in FIG. 2, in the first substrate 11, thermal conductivity κ in an x-direction and that in a y-direction are substantially uniform, and thermal conductivity κ in a z-direction is approximately equal to the thermal conductivities κ in the x-direction and the y-direction (κx≈κy≈κz), wherein the x-direction and the y-direction correspond to a plane direction of the substrate, and the z-direction corresponds to a thickness direction of the substrate. For example, in the case where an aluminum nitride sintered body is used for the first substrate 11, a substrate having thermal conductivity κ of about 100 to 200 W/m·K is used for the first substrate 11.

On the other hand, the second substrate 12 differs between its thermal conductivities λ in the x-direction and the y-direction corresponding to the plane direction. The relationship among the thermal conductivities λ of the second substrate 12 in different directions shown in FIG. 2, namely λx, λy, and λz, is expressed as: "thermal conductivity λx≈thermal conductivity λz>>thermal conductivity λy". That is, in the second substrate 12, the thermal conductivity λ in the x-direction corresponding to the plane direction and the thermal conductivity λ in the z-direction corresponding to the thickness direction are approximately equal, but they differ from the thermal conductivity λ in the y-direction corresponding to the plane direction. For example, the thermal conductivity λx and the thermal conductivity λz of the second substrate 12 are each about 1000 W/m·K, whereas the thermal conductivity λy of the second substrate 12 is about 4 W/m·K.

The electronic device can be produced by mounting the rectangular electronic element 2 on the mounting portion 11a located on the first principal surface of the substrate for mounting electronic element 1, and thereafter mounting the substrate for mounting electronic element 1 on a wiring substrate or a package for housing electronic element. Examples of the electronic element 2 mounted on the substrate for mounting electronic element 1 include light-emitting devices such as LD (Laser Diode) and light-receiving devices such as PD (Photo Diode). For example, the electronic element 2 is fixedly placed on the mounting portion 11a of one of the surface metal layers 13 via a joining material such as a Au—Sn material, and subsequently an electrode of the electronic element 2 and the other surface metal layer 13 are electrically connected to each other via a connecting member 3 such as a bonding wire. In this way, the electronic element 2 is mounted on the substrate for mounting electronic element 1. In the example shown in FIG. 4, the electrode of the electronic element 2 and the other surface metal layer 13 are electrically connected to each other via a plurality of connecting members 3. For example, as the wiring substrate or the package for housing electronic element on which the substrate for mounting electronic element 1 is mounted, like the first substrate 11, an insulating base formed of ceramics is used and the wiring substrate or the package for housing electronic element includes a wiring conductor on its surface. The surface metal layer 13 of the substrate for mounting electronic element 1 is electrically connected to the wiring conductor of the wiring substrate or the package for housing electronic element.

The substrate for mounting electronic element 1 according to this embodiment comprises: the first substrate 11 which includes the first principal surface, is made of an insulating material, and is quadrangular in shape; the surface metal layer 13 which is located on the first principal surface, and includes the rectangular electronic element 2 mounting portion 11a; and the second substrate 12 which is located on the second principal surface opposed to the first principal surface, is made of a carbon material, and includes the third principal surface facing the second principal surface and the fourth principal surface opposed to the third principal surface, Moreover, the bonding metal layer 14 is located on the second principal surface. In a transparent plan view, heat conduction of the second substrate 12 in a direction perpendicular to the longitudinal direction of the mounting portion 11a is greater than heat conduction of the second substrate 12 in the longitudinal direction of the mounting portion 11a, and a width dimension of the bonding metal layer 14 is greater than or equal to a width dimension of the surface metal layer 13 in a direction perpendicular to the longitudinal direction of the mounting portion 11a. This allows good bonding of a substrate area wider than the surface metal layer 13 with the bonding metal layer 14 in a direction perpendicular to the longitudinal direction of the mounting portion 11a. Thus, heat from the surface metal layer 13 is readily transmitted toward the second substrate 12, can be conducted in a direction perpendicular to the longitudinal direction of the mounting portion 11a through the second substrate 12 well, and is satisfactorily dissipated in the entire mounting portion 11a. This makes it possible to reduce expansion of the electronic element 2 under the heat generated from the electronic element 2, restrain the electronic element 2 from becoming misaligned or reduce distortion of the substrate for mounting electronic element 1, and eventually achieve satisfactory light emission.

The electronic device according to this embodiment includes: the substrate for mounting electronic element 1 described above; the electronic element 2 mounted on the mounting portion 11a of the substrate for mounting electronic element 1; and the wiring substrate or the package for housing electronic element on which the substrate for mounting electronic element 1 is mounted. Thus, the electronic device remains reliable for long periods.

The electronic device according to this embodiment is connected at the wiring conductor to the connection pad of the module substrate via a joining material such as solder, thereby constituting the electronic module. Thus, the electronic element 2 and the connection pad of the module substrate are electrically connected.

The electronic module according to this embodiment includes: the electronic device described above; and the module substrate to which the electronic device is connected. Thus, the electronic module remains reliable for long periods.

Figure 3A:
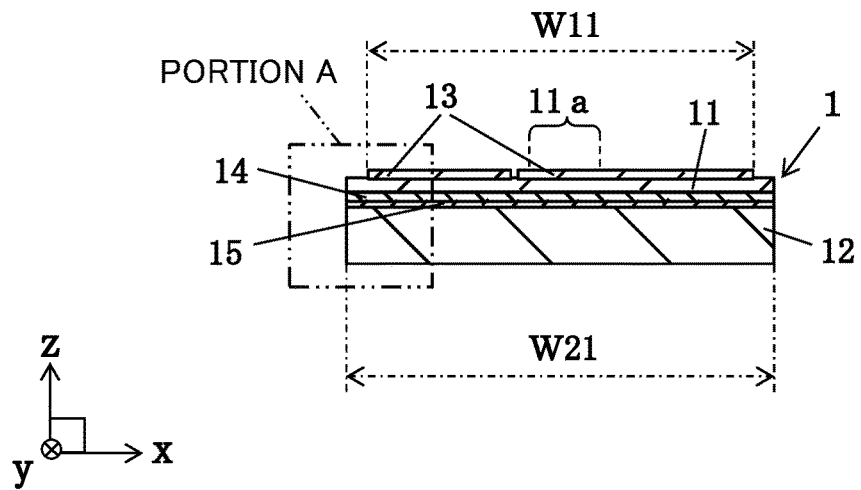
FIG. 3A is a vertical sectional view of the substrate for mounting electronic element taken along the line A-A shown in FIG. 1A.
Figure 3B:
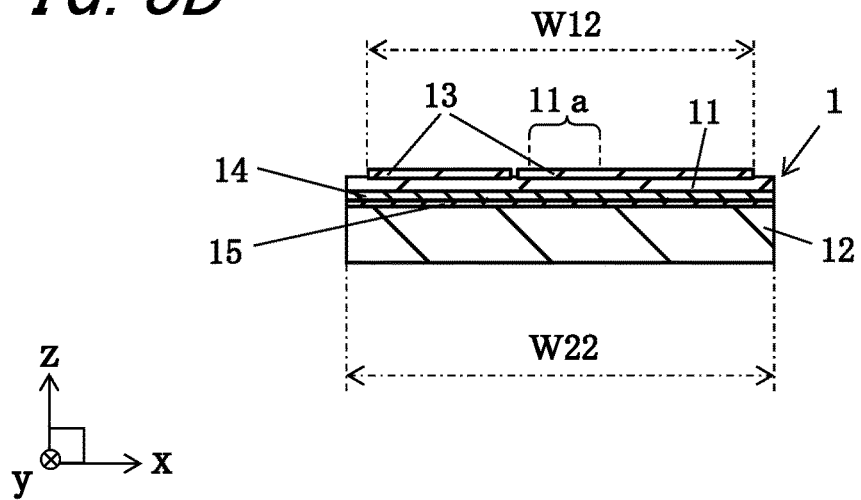
FIG. 3B is a vertical sectional view of the substrate for mounting electronic element taken along the line B-B shown in FIG. 1A.
Figure 3C:
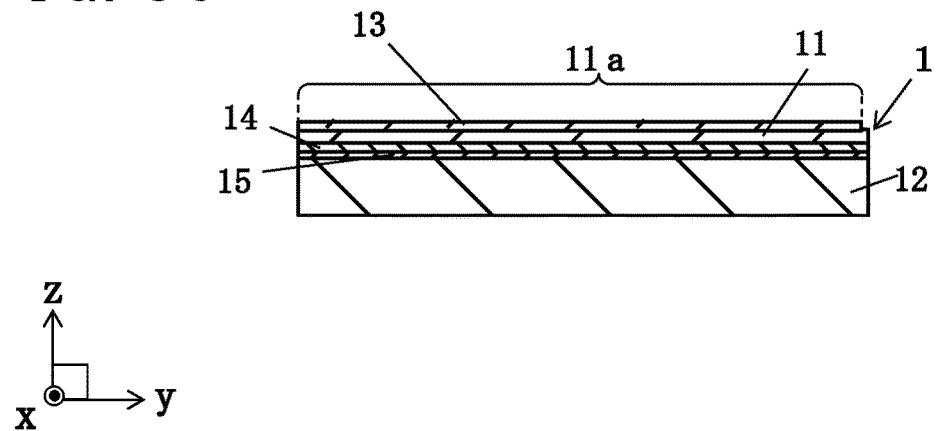
FIG. 3C is a vertical sectional view of the substrate for mounting electronic element taken along the line C-C shown in FIG. 1A.
Figure 4:
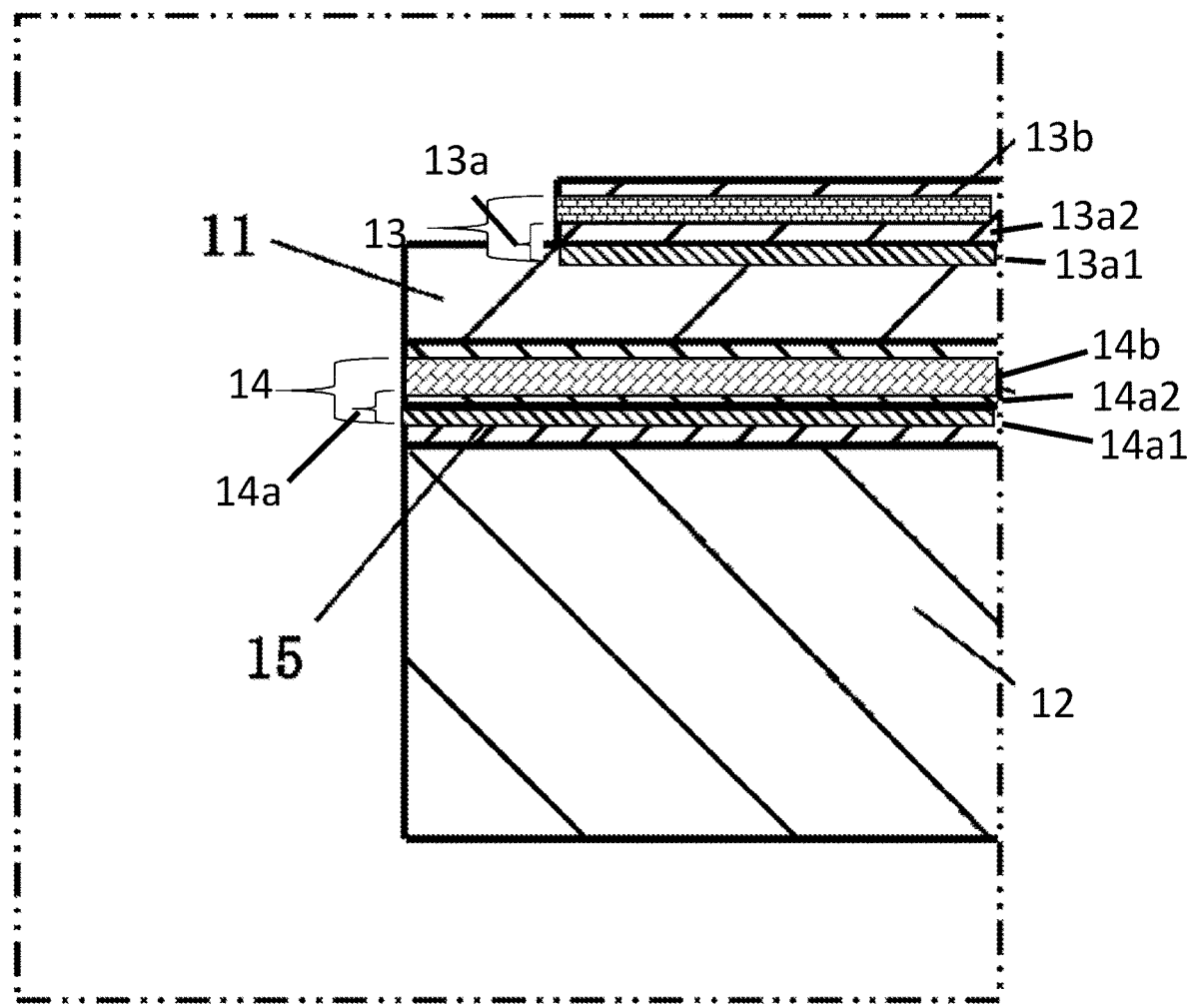
FIG. 4 is a vertical sectional view showing in enlarged dimension main components in the portion A shown in FIG. 3A.
Figure 4:
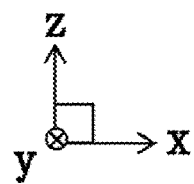
Figure 5A:
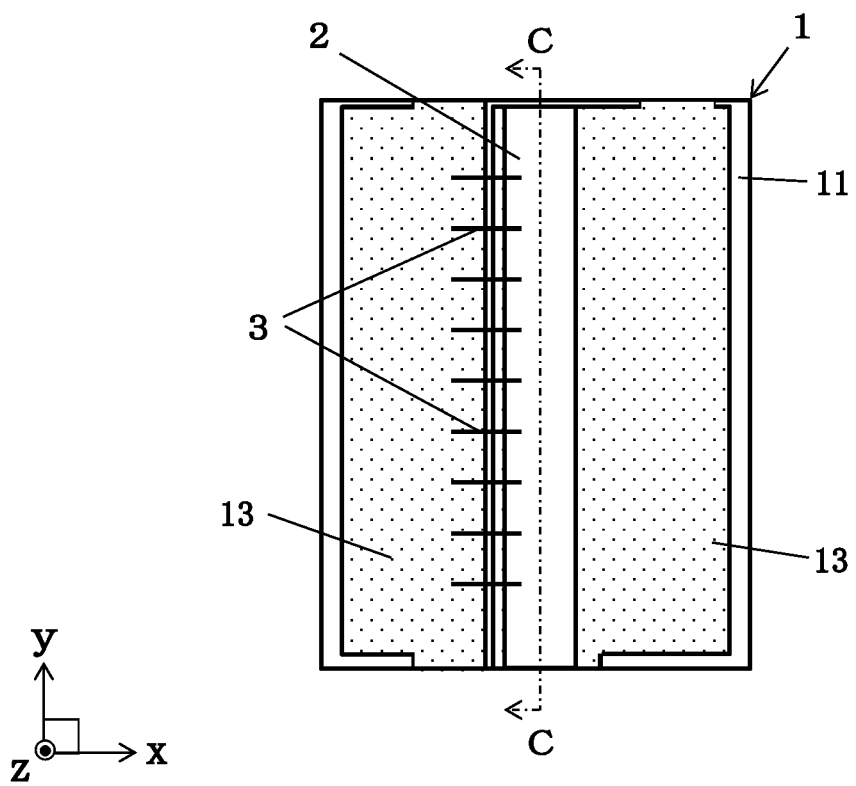
FIG. 5A is a top plan view showing the substrate for mounting electronic element shown in FIG. 1A equipped with an electronic element.
Figure 5B:
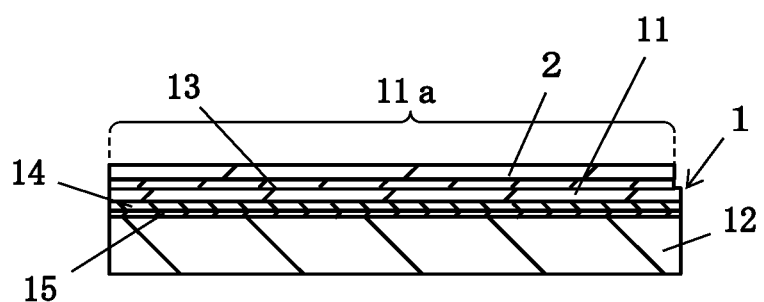
FIG. 5B is a vertical sectional view of the substrate taken along the line B-B shown in FIG. 5A.
Figure 5B:
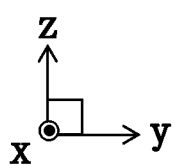

As in the example shown in FIGS. 3A to 3C, when the width of the bonding metal layer 14 is greater than the width of the surface metal layer 13 in a direction perpendicular to the longitudinal direction of the mounting portion 11a (W21>W11, W22>W12), this makes it possible to facilitate transfer of heat from the surface metal layer 13 toward the second substrate 12, and thus achieve more satisfactory heat conduction in a direction perpendicular to the longitudinal direction of the mounting portion 11a through the second substrate 12.

As in the example shown in FIGS. 1A to 3C, when each end of the bonding metal layer 14 in a direction perpendicular to the longitudinal direction of the mounting portion 11a lies along the outer edge of the first substrate 11 in closer proximity to the outer edge of the first substrate 11 than each end of the surface metal layer 13, this allows good bonding of a substrate area wider than the surface metal layer 13 with the bonding metal layer 14 along the outer edge of the first substrate 11 in a direction perpendicular to the longitudinal direction of the mounting portion 11a. Thus, heat from the surface metal layer 13 is readily transmitted toward the second substrate 12, can be conducted in a direction perpendicular to the longitudinal direction of the mounting portion 11a through the second substrate 12 well, and is satisfactorily dissipated in the entire mounting portion 11a. This makes it possible to reduce expansion of the electronic element 2 under the heat generated from the electronic element 2, restrain the electronic element 2 from becoming misaligned or reduce distortion of the substrate for mounting electronic element 1, and eventually achieve satisfactory light emission.

If the spacing between the end of the bonding metal layer and the end of the surface metal layer 13 in a direction perpendicular to the longitudinal direction of the mounting portion 11a is greater than or equal to the substrate thickness T1 of the first substrate 11 along the outer edge of the first substrate 11, in a transparent plan view, heat from the surface metal layer 13 is readily transmitted along the outer edge of the first substrate 11 and at each end toward the second substrate 12, and can be conducted in a direction perpendicular to the longitudinal direction of the mounting portion 11a through the second substrate 12 well.

Moreover, if a difference between the width of the bonding metal layer 14 and the width of the surface metal layer 13 in a direction perpendicular to the longitudinal direction of the mounting portion 11a is twice the substrate thickness T1 of the first substrate 11 or greater (W21−W11≥2T1, W22−W12≥2T1) in a transparent plan view, heat from the surface metal layer 13 is readily transmitted along the outer edge of the first substrate 11 and at each end toward the second substrate 12, and can be conducted in a direction perpendicular to the longitudinal direction of the mounting portion 11a through the second substrate 12 well.

While the surface metal layer 13 located on the first principal surface of the first substrate 11 or the bonding metal layer 14 located on the second principal surface of the first substrate 11 is formed by a thin-film method in the above-described embodiment, these metal layers may be formed by heretofore known co-fire processing or post-fire processing, for example. In the case where the surface metal layer 13 or bonding metal layer 14 is used, the surface metal layer 13 or the bonding metal layer 14 is formed on the first principal surface or the second principal surface of the first substrate 11 in advance of the joining together of the first substrate 11 and the second substrate 12. In the interest of good planarity of the first substrate 11, as in the first embodiment thus far described, the surface metal layer 13 located on the first principal surface of the first substrate 11 or the bonding metal layer 14 located on the second principal surface of the first substrate 11 may be formed by a thin-film method.

Second Embodiment

The following describes an electronic device according to a second embodiment of the disclosure with reference to FIGS. 6A to 10B.

A substrate for mounting electronic element 1 according to the second embodiment differs from the substrate for mounting electronic element 1 according to the preceding embodiment in that the substrate for mounting electronic element 1 includes a third substrate 16 which is located on the fourth principal surface of the second substrate 12, is made of an insulating material, and includes a seventh principal surface facing the fourth principal surface and an eighth principal surface opposed to the seventh principal surface.

Figure 6A:
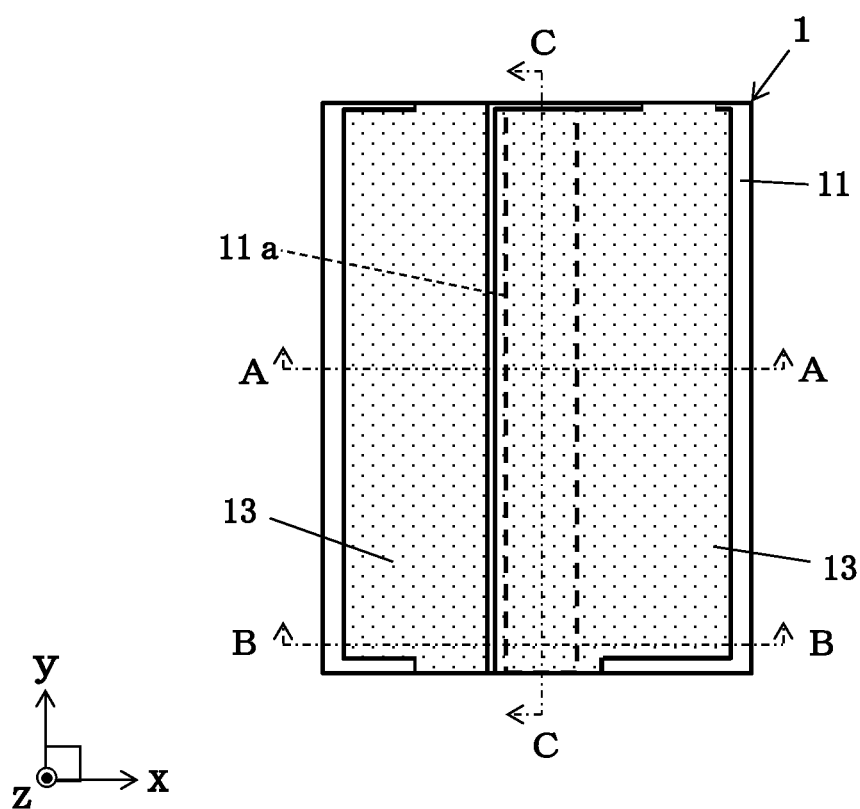
FIG. 6A is a top plan view showing a substrate for mounting electronic element according to a second embodiment.
Figure 6B:
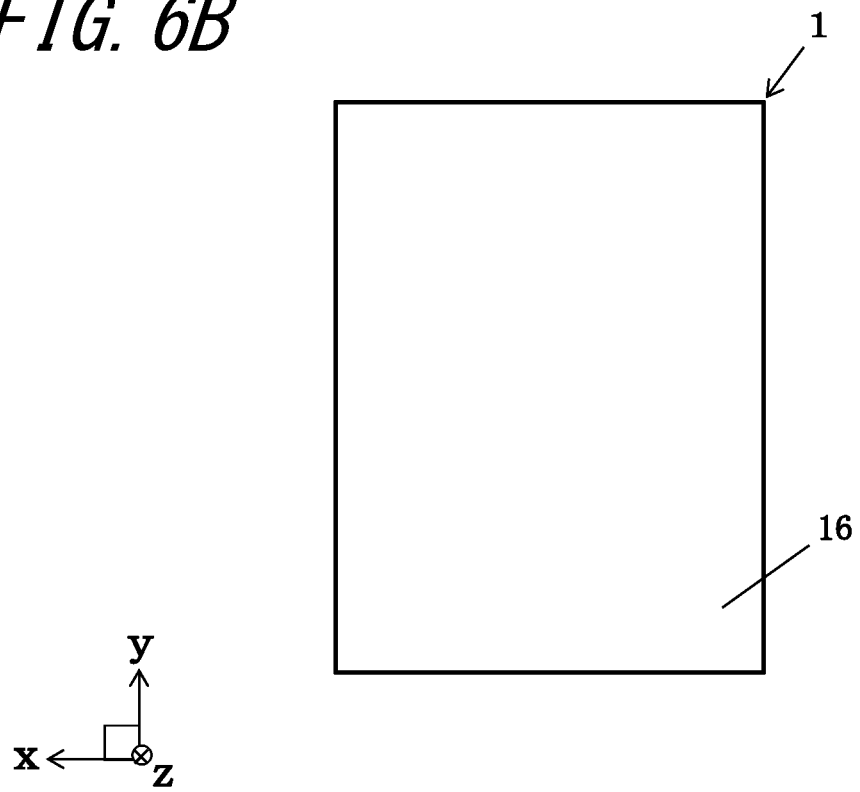
FIG. 6B is a bottom plan view of the substrate shown in FIG. 6A.
Figure 7:
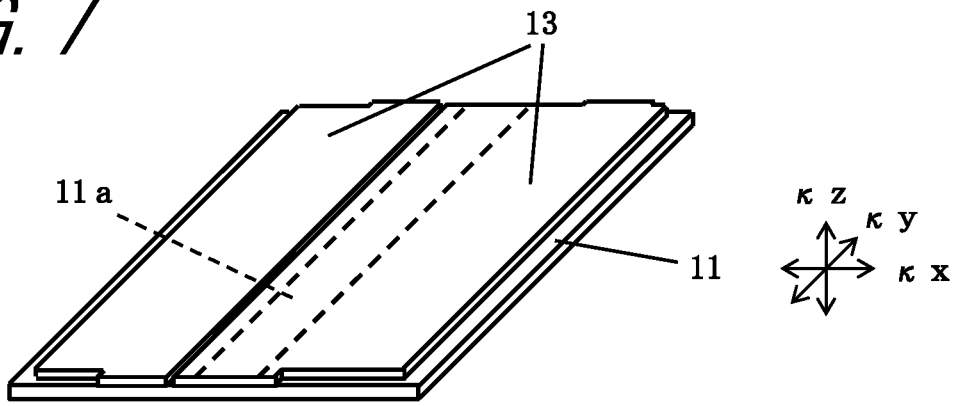
FIG. 7 is a perspective view showing the first substrate, the second substrate, and a third substrate of the substrate for mounting electronic element shown in FIGS. 6A and 6B in a disassembled state.
Figure 7:
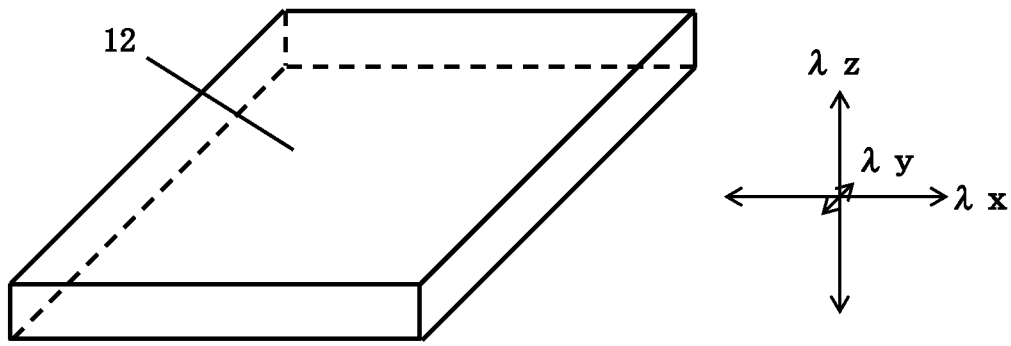
Figure 7:
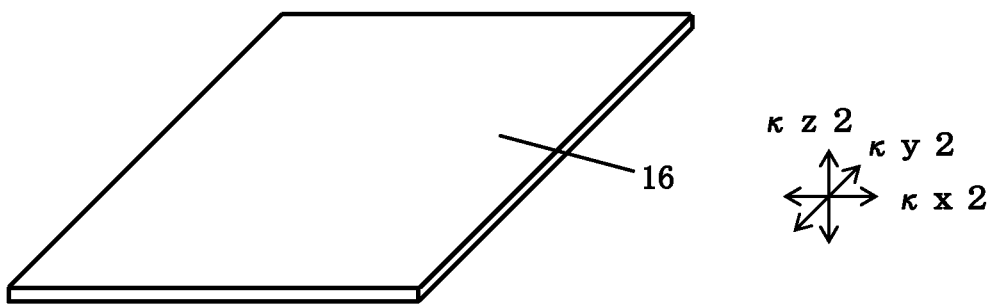
Figure 7:
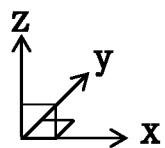
Figure 8A:
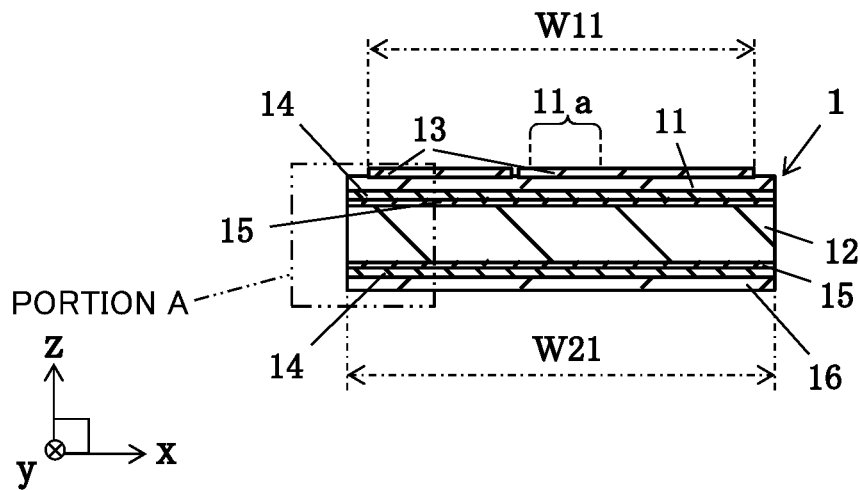
FIG. 8A is a vertical sectional view of the substrate for mounting electronic element taken along the line A-A shown in FIG. 6A.
Figure 8B:
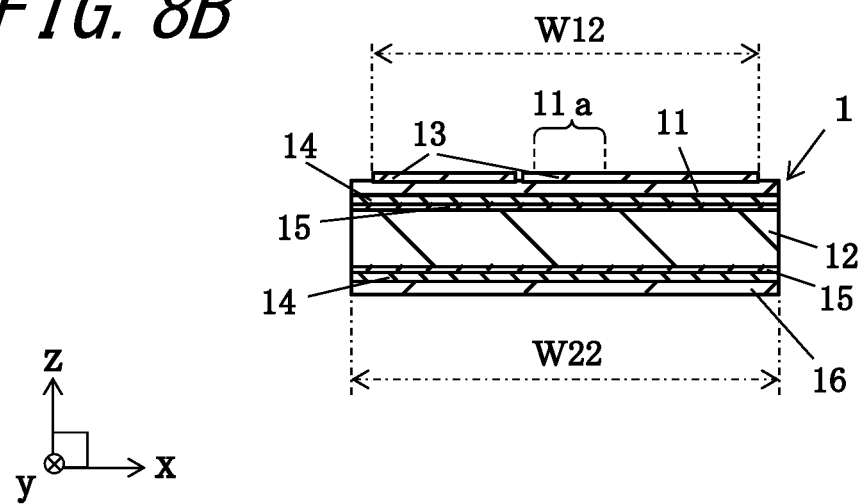
FIG. 8B is a vertical sectional view of the substrate for mounting electronic element taken along the line B-B shown in FIG. 6A.
Figure 8C:
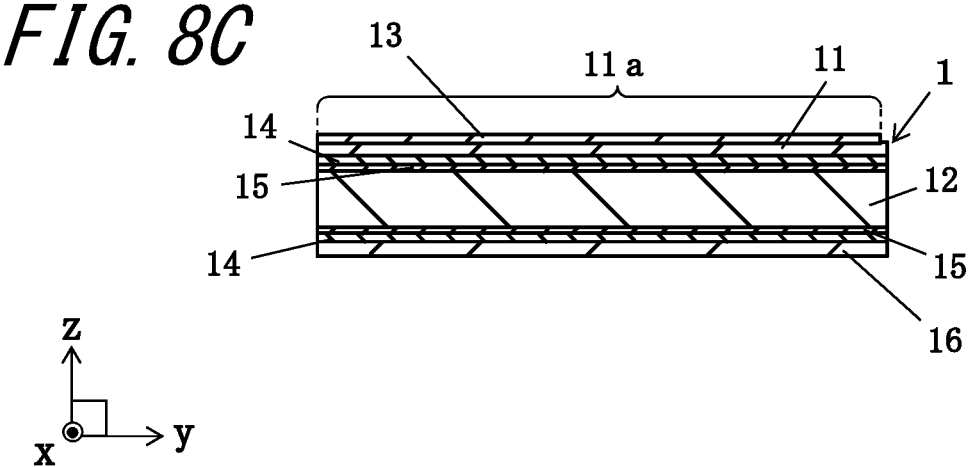
FIG. 8C is a vertical sectional view of the substrate for mounting electronic element taken along the line C-C shown in FIG. 6A.
Figure 9:
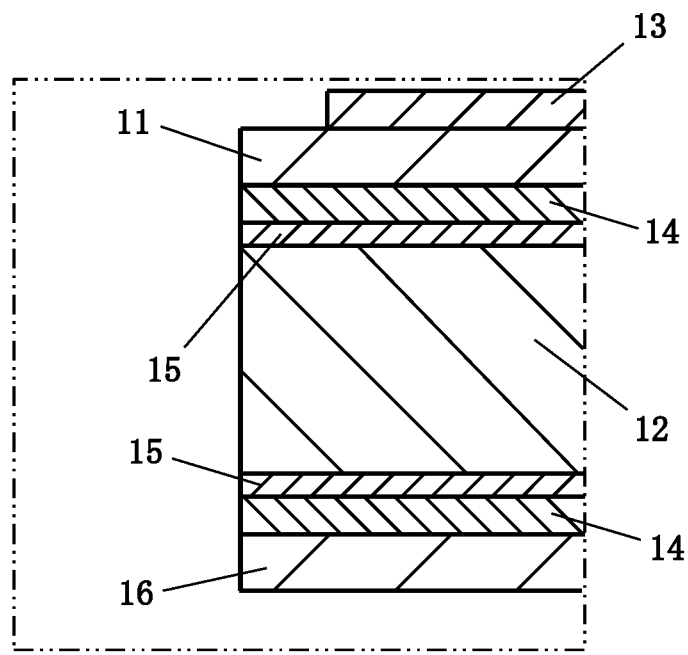
FIG. 9 is a vertical sectional view showing in enlarged dimension main components in the portion A shown in FIG. 8A.
Figure 9:
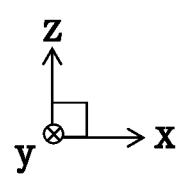
Figure 10A:
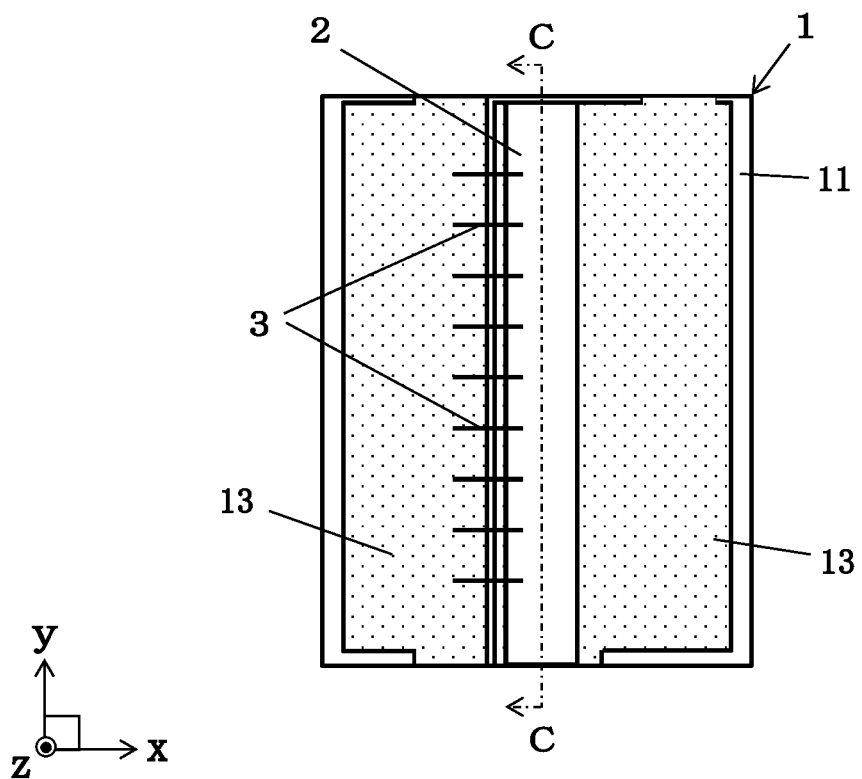
FIG. 10A is a top plan view showing the substrate for mounting electronic element shown in FIG. 5A equipped with an electronic element.
Figure 10B:
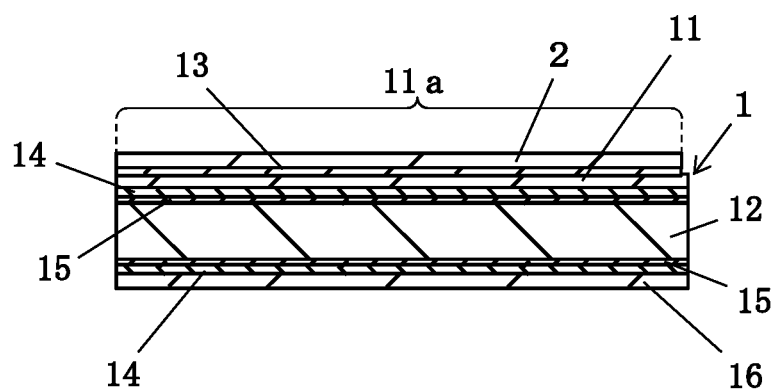
FIG. 10B is a vertical sectional view of the substrate taken along the line B-B shown in FIG. 10A.

In FIGS. 6A and 6B, the surface metal layer 13 of this embodiment is indicated by a dot-shaded area.

In the substrate for mounting electronic element 1 according to the second embodiment, as in the substrate for mounting electronic element 1 according to the preceding embodiment, with good bonding of a substrate area wider than the surface metal layer 13 with the bonding metal layer 14 in a direction perpendicular to the longitudinal direction of the mounting portion 11a, heat from the surface metal layer 13 is readily transmitted toward the second substrate 12, can be conducted in a direction perpendicular to the longitudinal direction of the mounting portion 11a through the second substrate 12 well, and is satisfactorily dissipated in the entire mounting portion 11a. This makes it possible to reduce expansion of the electronic element 2 under the heat generated from the electronic element 2, restrain the electronic element 2 from becoming misaligned or reduce distortion of the substrate for mounting electronic element 1, and eventually achieve satisfactory light emission.

In the substrate for mounting electronic element 1 according to the second embodiment, the first substrate 11 is quadrangular in plan configuration. The second substrate 12 is quadrangular in plan configuration. The third substrate 16 is quadrangular in plan configuration. The first substrate 11, the second substrate 12, and the third substrate 16 are bonded together to form a quadrangular composite substrate. Note that the "quadrangular" configuration means the shape of a quadrilateral such as a square and a rectangle. In the embodiment shown in FIGS. 6A to 9, the first substrate 11, the second substrate 12, and the third substrate 16 are each rectangular in plan configuration. Thus, the rectangular composite substrate is formed.

The third substrate 16 may be formed by using the same material and method as those used for the formation of the first substrate 11 as described above. As in the example shown in FIG. 7, in the third substrate 16, like the first substrate 11, thermal conductivity κ2 in an x-direction and that in a y-direction are substantially uniform, and thermal conductivity κ2 in a z-direction is approximately equal to the thermal conductivities κ2 in the x-direction and the y-direction (κx2≈κy2≈κz2), wherein the x-direction and the y-direction correspond to a plane direction of the third substrate 16, and the z-direction corresponds to a thickness direction of the third substrate 16. For example, in the case where an aluminum nitride sintered body is used for the third substrate 16, a substrate having thermal conductivity κ2 of about 100 to 200 W/m·K is used for the third substrate 16.

Concurrent bonding of the first substrate 11, the second substrate 12, and the third substrate 16 with one another is entirely satisfactory. In this case, for example, after successive laminations of the first substrate 11, the second substrate 12, and the third substrate 16 in the order named, a pressure is applied toward both of the first principal surface of the first substrate 11 and the eighth principal surface of the third substrate 16, so that the first substrate 11, the second substrate 12, and the third substrate 16 can be satisfactorily joined together. This allows the highly reliable substrate for mounting electronic element 1 to be obtained. Moreover, the concurrent bonding together of the first substrate 11, the second substrate 12, and the third substrate 16 suppresses exposure of the second substrate 12 in the substrate making operation, and thus can reduce substrate deterioration caused by external air.

In the substrate for mounting electronic element 1 according to the second embodiment, the second substrate 12 is located between the first substrate 11 and the third substrate 16. This reduces distortion of the substrate for mounting electronic element 1 resulting from the difference in thermal expansion between the first substrate 11 and the second substrate 12, and makes it possible to restrain the electronic element 2 from becoming misaligned or reduce distortion of the substrate for mounting electronic element 1, and eventually achieve satisfactory light emission.

Especially, in the case where the insulating material which is substantially identical with that of the first substrate 11 is used for the third substrate 16, that is, for example, in the case where an aluminum nitride sintered body having thermal conductivity of 150 W/m·K is used for the first substrate 11, an aluminum nitride sintered body having thermal conductivity of 150 W/m·K is used for the third substrate 16. This makes it possible to reduce distortion of the substrate for mounting electronic element 1 more effectively, and thus facilitate satisfactory light emission.

Moreover, a substrate thickness T3 of the third substrate 16, like the substrate thickness T1 of the first substrate 11, falls in the range of about 50 μm to 500 μm, for example. If the substrate thickness T1 of the first substrate 11 and the substrate thickness T3 of the third substrate 16 are substantially equal, with a tolerance between them limited to about 10% ($0.90T1 \leq T3 \leq 1.10T1$), this makes it possible to reduce distortion of the substrate for mounting electronic element 1 more effectively, and thus facilitate satisfactory light emission. For example, in the case where the substrate thickness of the first substrate 11 is set at 100 μm, the substrate thickness of the third substrate 16 may be set at 100 μm (within the range of 90 μm to 110 μm).

Moreover, as in the example shown in FIGS. 6A to 9, in the case where the third substrate 16 is provided at its fifth principal surface with the bonding metal layer 14, like the first substrate 11-side bonding metal layer 14, the bonding metal layer 14 located on the third substrate 16 can be satisfactorily joined to the second substrate 12 with the joining material 15. The bonding metal layer 14 located on the fifth principal surface of the third substrate 16 may be formed in a similar manner to that for forming the bonding metal layer 14 located on the second principal surface of the first substrate 11.

Moreover, like the bonding metal layer 14 located on the second principal surface of the first substrate 11, if the width of the bonding metal layer 14 located on the fifth principal surface of the third substrate 16 is greater than the width of the surface metal layer 13 in a direction perpendicular to the longitudinal direction of the mounting portion 11a, this allows good bonding of a substrate area wider than the surface metal layer 13 with the bonding metal layer 14 in a direction perpendicular to the longitudinal direction of the mounting portion 11a. Thus, heat from the second substrate 12 is readily transmitted toward the third substrate 16, can be conducted in a direction perpendicular to the longitudinal direction of the mounting portion 11a through the second substrate 12 and the third substrate 16, and is satisfactorily dissipated in the entire mounting portion 11a. This makes it possible to reduce expansion of the electronic element 2 under the heat generated from the electronic element 2, restrain the electronic element 2 from becoming misaligned or reduce distortion of the substrate for mounting electronic element 1, and eventually achieve satisfactory light emission.

Moreover, the third substrate 16 may be provided at its sixth principal surface with a bonding layer. For example, the bonding layer located on the third substrate 16 can be used for the joining of the substrate for mounting electronic element 1 and a conductor layer provided in the wiring substrate or the package for housing electronic element. The bonding layer may be formed in a similar manner to that for forming the surface metal layer 13 as described above.

Moreover, forming the bonding layer so as to lie over the entire area of the lower surface of the third substrate 16 allows satisfactory dissipation of heat from the substrate for mounting electronic element 1 into the wiring substrate or the package for housing electronic element.

Otherwise, the substrate for mounting electronic element 1 according to the second embodiment can be manufactured using a similar method to the method of manufacturing the substrate for mounting electronic element 1 according to the preceding embodiment.

Third Embodiment

The following describes an electronic device according to a third embodiment with reference to FIGS. 11A to 15B.

A substrate for mounting electronic element 1 according to the third embodiment differs from the substrate for mounting electronic element 1 according to the preceding embodiment in that the substrate for mounting electronic element 1 includes a frame-shaped fourth substrate 17 configured so as to surround the four sides of the second substrate 12.

Figure 11A:
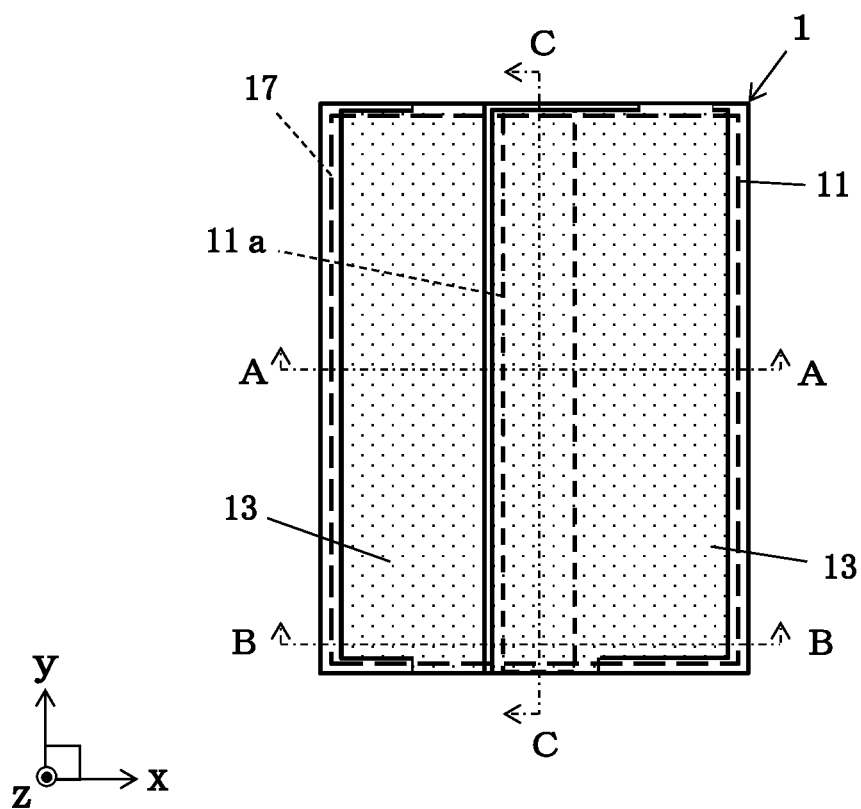
FIG. 11A is a top plan view showing a substrate for mounting electronic element according to a third embodiment.
Figure 11B:
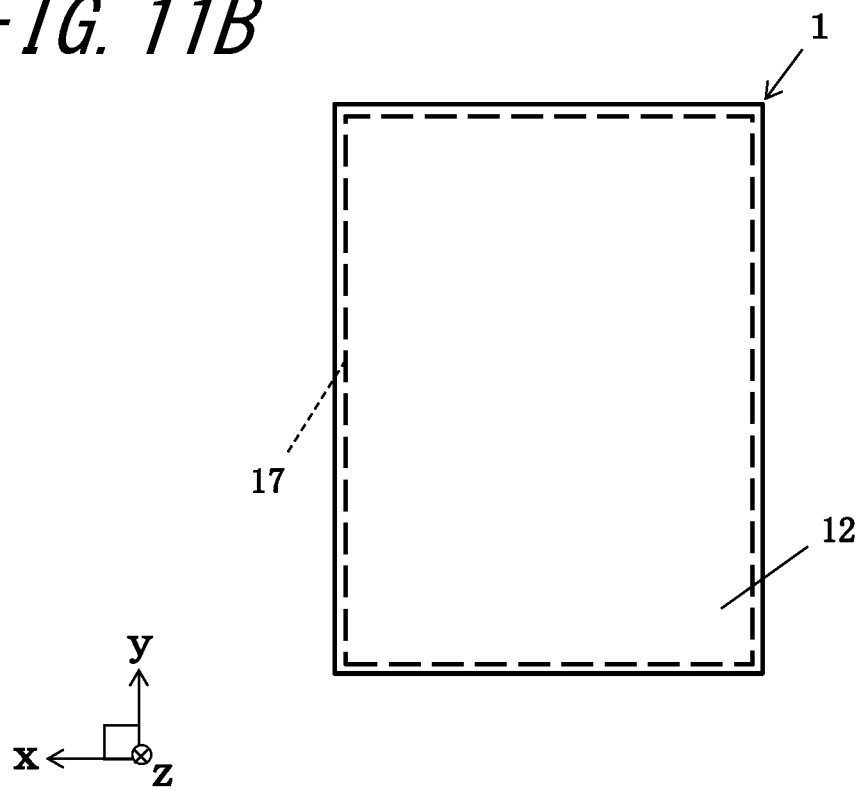
FIG. 11B is a bottom plan view of the substrate shown in FIG. 11A.
Figure 12:
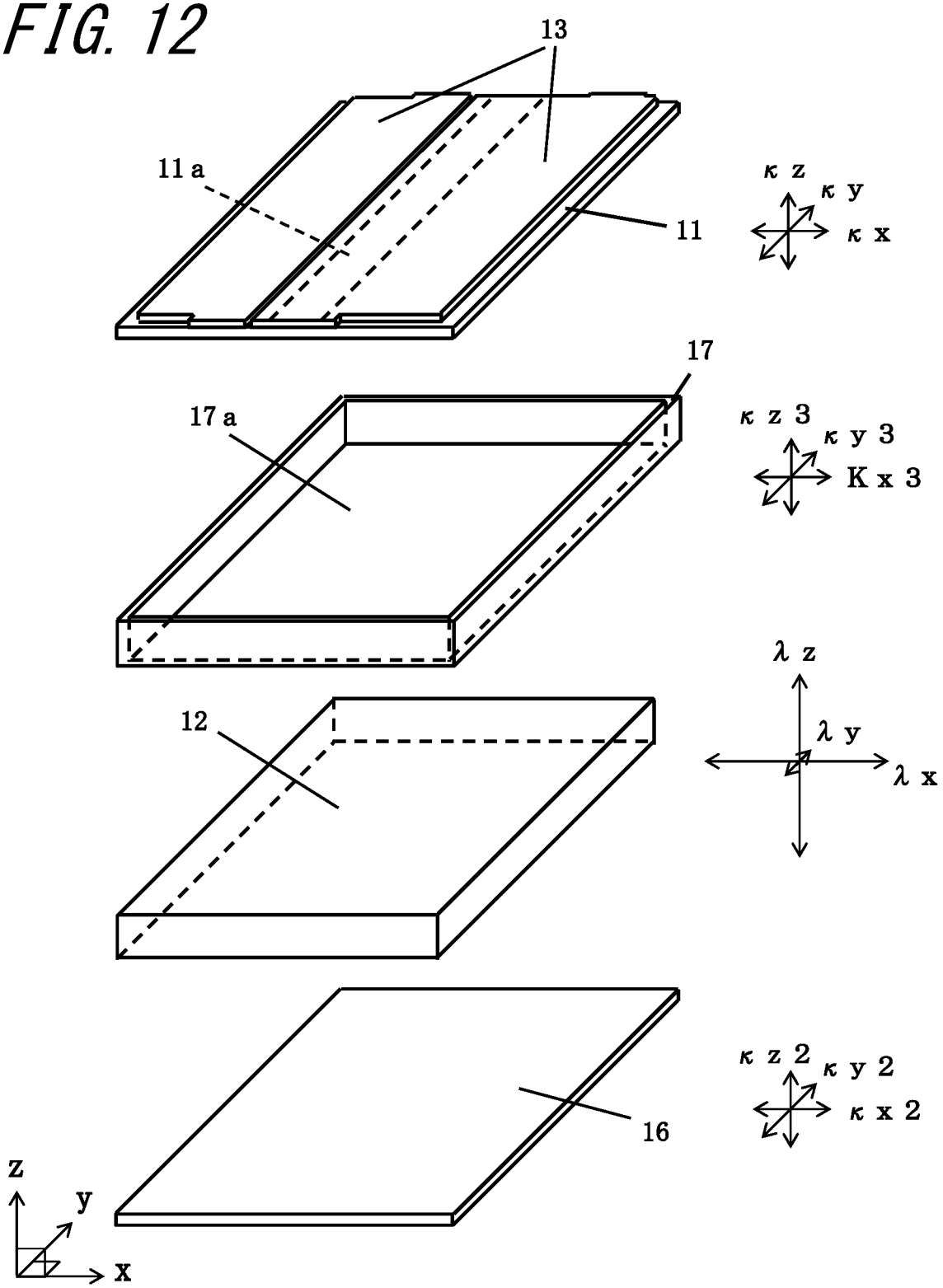
FIG. 12 is a perspective view showing the first substrate, the second substrate, the third substrate, and a fourth substrate of the substrate for mounting electronic element shown in FIGS. 11A and 11B in a disassembled state.
Figure 13A:
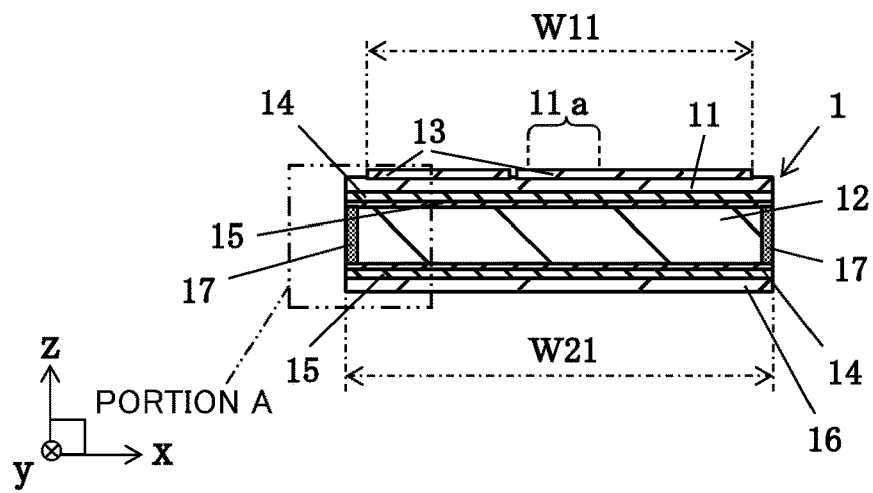
FIG. 13A is a vertical sectional view of the substrate for mounting electronic element taken along the line A-A shown in FIG. 11A.
Figure 13B:
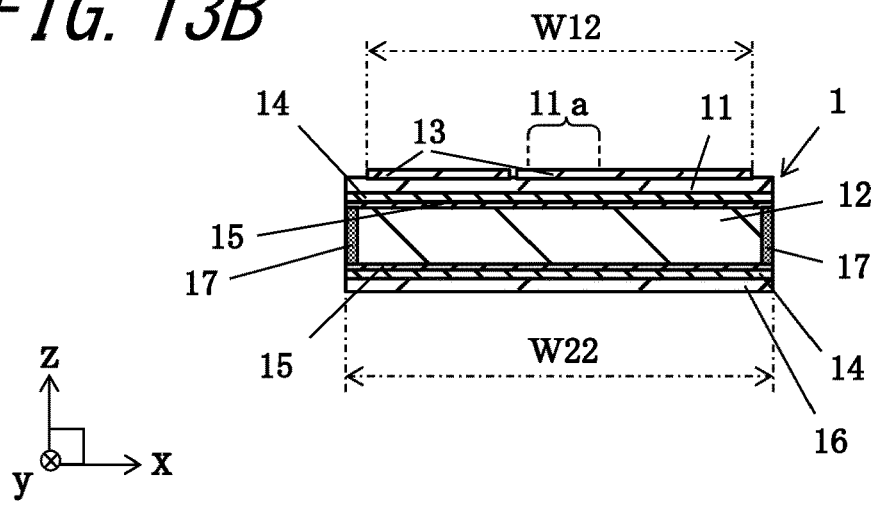
FIG. 13B is a vertical sectional view of the substrate for mounting electronic element taken along the line B-B shown in FIG. 11A.
Figure 13C:
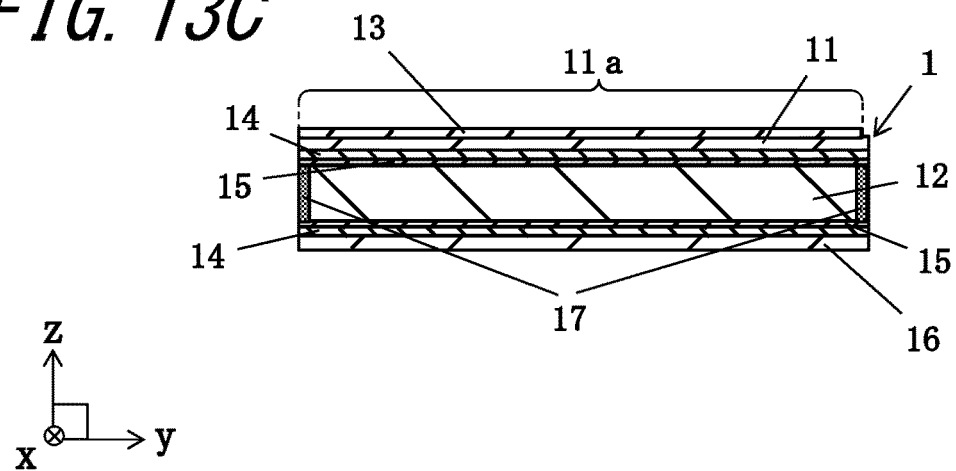
FIG. 13C is a vertical sectional view of the substrate for mounting electronic element taken along the line C-C shown in FIG. 11A.
Figure 14:
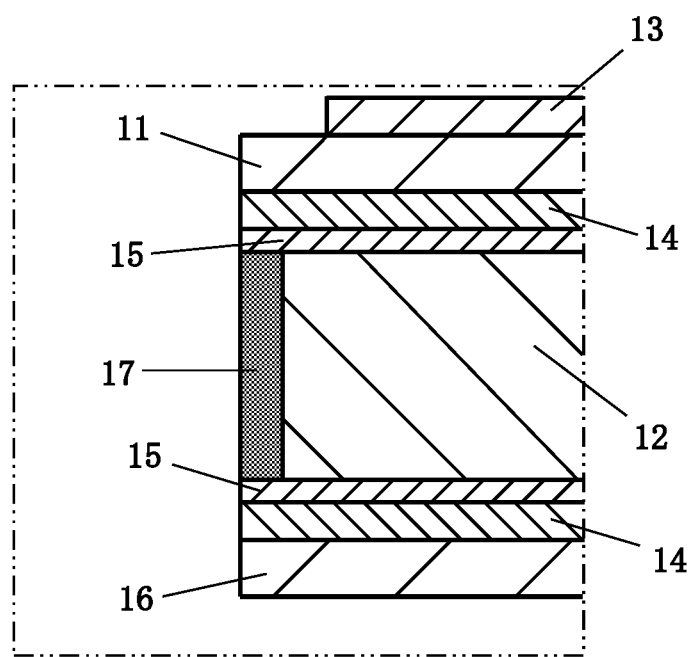
FIG. 14 is a vertical sectional view showing in enlarged dimension main components in the portion A shown in FIG. 13A.
Figure 14:
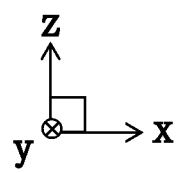
Figure 15A:
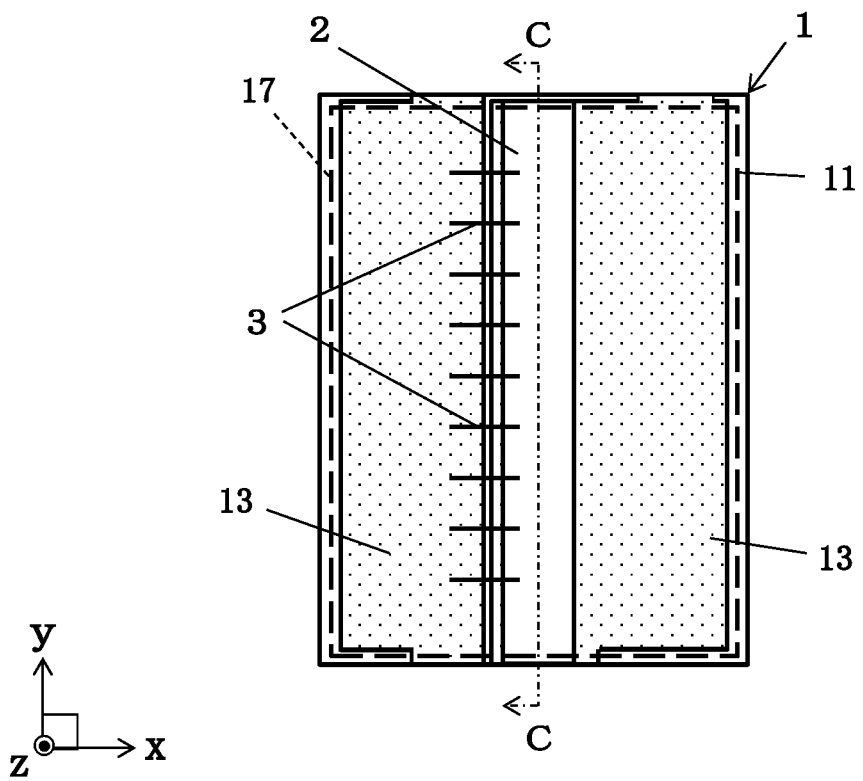
FIG. 15A is a top plan view showing the substrate for mounting electronic element shown in FIG. 11A equipped with an electronic element.
Figure 15B:
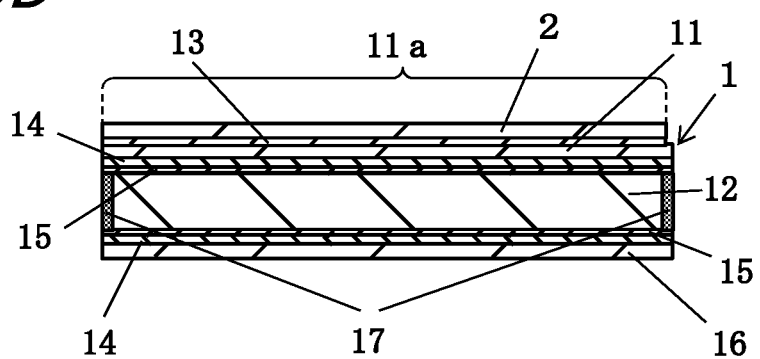
FIG. 15B is a vertical sectional view of the substrate taken along the line B-B shown in FIG. 15A.
Figure 15B:
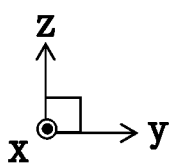

In FIGS. 11A and 11B, the outer edge of the second substrate 12 of this embodiment in a transparent plan view is indicated by dashed lines, and, the surface metal layer 13 of this embodiment is indicated by a dot-shaded area.

In the substrate for mounting electronic element 1 according to the third embodiment, as in the substrate for mounting electronic element 1 according to the preceding embodiment, with good bonding of a substrate area wider than the surface metal layer 13 with the bonding metal layer 14 in a direction perpendicular to the longitudinal direction of the mounting portion 11a, heat from the surface metal layer 13 is readily transmitted toward the second substrate 12, can be conducted in a direction perpendicular to the longitudinal direction of the mounting portion 11a through the second substrate 12, and is satisfactorily dissipated in the entire mounting portion 11a. This makes it possible to reduce expansion of the electronic element 2 under the heat generated from the electronic element 2, restrain the electronic element 2 from becoming misaligned or reduce distortion of the substrate for mounting electronic element 1, and eventually achieve satisfactory light emission.

A substrate thickness T4 of the fourth substrate 17, like the substrate thickness T2 of the second substrate 12, falls in the range of about 100 μm to 2000 μm, for example. The substrate thickness T2 of the second substrate 12 and the substrate thickness T4 of the fourth substrate 17 are substantially equal, with a tolerance between them limited to about 5% ($0.95T2 \geq T4 \geq 1.05T2$). If the relation between the first substrate 11 and the second substrate 12 given by: T2>T1 is fulfilled and the relation between the first substrate 11 and the fourth substrate 17 given by: T4>T1 is fulfilled, heat from the first substrate 11 can be satisfactorily dissipated to the fourth substrate 17.

As in the example shown in FIGS. 11A and 11B, in the fourth substrate 17, thermal conductivity κ3 in an x-direction and that in a y-direction are substantially uniform, and thermal conductivity κ3 in a z-direction is approximately equal to the thermal conductivities κ3 in the x-direction and the y-direction ($\kappa x3 \approx \kappa y3 \approx \kappa z3$), wherein the x-direction and the y-direction correspond to a plane direction of the substrate, and the z-direction corresponds to a thickness direction of the substrate. For example, in the case where an aluminum nitride substrate is used for the fourth substrate 17, a substrate having thermal conductivity κ3 of about 100 to 200 W/m·K is used for the fourth substrate 17. For example, in the case where copper is used for the fourth substrate 17, a substrate having thermal conductivity κ3 of about 400 W/m·K is used for the fourth substrate 17.

Especially, if the insulating material which is substantially identical with that of the first substrate 11 is used for the third substrate 16, for example, in the case where the first substrate 11 is formed of an aluminum nitride sintered body having thermal conductivity of 150 W/m·K, and an aluminum nitride sintered body having thermal conductivity of 150 W/m·K is preferably used for the third substrate 16, this makes it possible to reduce distortion of the substrate for mounting electronic element 1 more effectively, and thus facilitate satisfactory light emission.

For example, in the case where the insulating material which is substantially identical with those of the first substrate 11 and the third substrate 16 is used for the fourth substrate 17, that is, for example, in the case where an aluminum nitride sintered body having thermal conductivity of 150 W/m·K is used for the first substrate 11 and the third substrates 16, and an aluminum nitride sintered body having thermal conductivity of 150 W/m·K is used for the fourth substrate 17, provision of the bonding metal layer 14 on each of the seventh and eighth principal surfaces of the fourth substrate 17 allows good bonding with the bonding metal layers 14 located on the first substrate 11 and the third substrate 16, respectively.

In the substrate for mounting electronic element 1 according to the third embodiment, the first substrate 11 is quadrangular in plan configuration. The second substrate 12 is quadrangular in plan configuration. The third substrate 16 is quadrangular in plan configuration. The fourth substrate 17 is shaped in a frame which is quadrangular in plan configuration. The first substrate 11, the second substrate 12, the third substrate 16, and the fourth substrate 17 are bonded together to form a quadrangular composite substrate. In the example shown in FIGS. 11A to 14, the first substrate 11, the second substrate 12, and the third substrate 16 each have a rectangular shape, whereas the fourth substrate 17 has a rectangular frame shape. The first substrate 11, the second substrate 12, the third substrate 16, and the fourth substrate 17 are bonded together to form a rectangular composite substrate.

A procedure for constructing the substrate for mounting electronic element 1 according to the third embodiment is as follows. The fourth substrate 17 is provided in advance with a through hole for receiving the second substrate 12. The outer periphery of the second substrate 12 is joined to the inner periphery of the through hole 17a of the fourth substrate 17 with a joining material 15 formed of an active brazing filler metal such as a Ti—Cu—Ag alloy or a Ti—Sn—Ag—Cu alloy, and subsequently the fourth third substrate 16 with the second substrate 12 fitted therein is bonded at its principal surfaces to the first substrate 11 and the third substrate 16 with the joining materials 15.

Concurrent bonding of the first substrate 11, the second substrate 12, the third substrate 16, and the fourth substrate 17 with one another is entirely satisfactory. For example, the second substrate 12 may be fitted in the through hole of the fourth substrate 17, and the first substrate 11 and the third substrate 16 may be bonded to the second substrate 12 and the fourth substrate 17. In this case, for example, a pressure is applied toward both of the first principal surface of the first substrate 11 and the sixth principal surface of the third substrate 16, so that the first substrate 11, the second substrate 12, the third substrate 16, and the fourth substrate 17 can be satisfactorily joined together. This allows the highly reliable substrate for mounting electronic element 1 to be obtained. Moreover, the concurrent bonding together of the first substrate 11, the second substrate 12, the third substrate 16, and the fourth substrate 17 suppresses exposure of the second substrate 12 in the substrate making operation, and thus can reduce substrate deterioration caused by external air.

Otherwise, the substrate for mounting electronic element 1 according to the third embodiment can be manufactured using a similar method to the method of manufacturing the substrate for mounting electronic element 1 according to the preceding embodiment.

Fourth Embodiment

The following describes an electronic device according to a fourth embodiment of the disclosure with reference to FIGS. 16A to 17C.

A substrate for mounting electronic element 1 according to the fourth embodiment differs from the substrate for mounting electronic element 1 according to the preceding embodiment in that a plurality of mounting portions 11a are arranged. In the substrate for mounting electronic element 1 according to the fourth embodiment, the direction of arranging the plurality of mounting portions 11a conforms to the longitudinal direction of the mounting portion 11a (y-direction as viewed in FIGS. 16A to 17C).

Figure 16A:
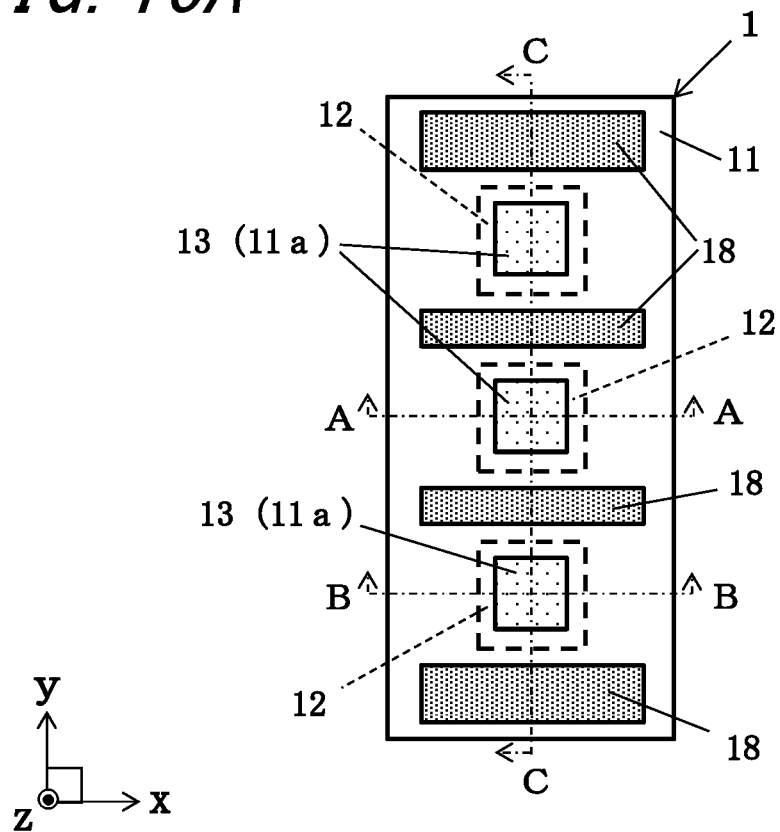
FIG. 16A is a top plan view showing a substrate for mounting electronic element according to a fourth embodiment.
Figure 16B:
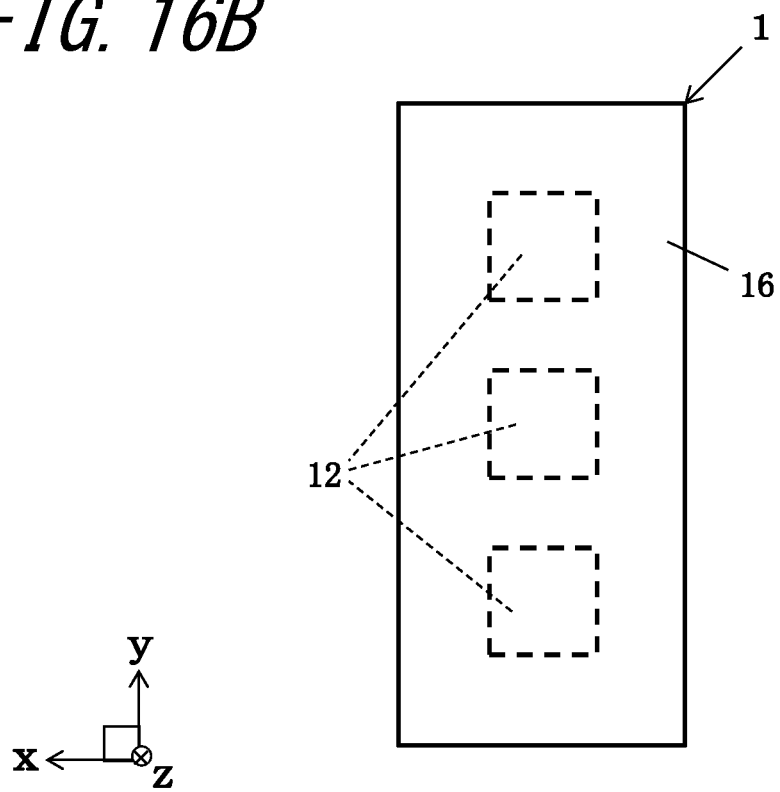
FIG. 16B is a bottom plan view of the substrate shown in FIG. 16A.
Figure 17A:
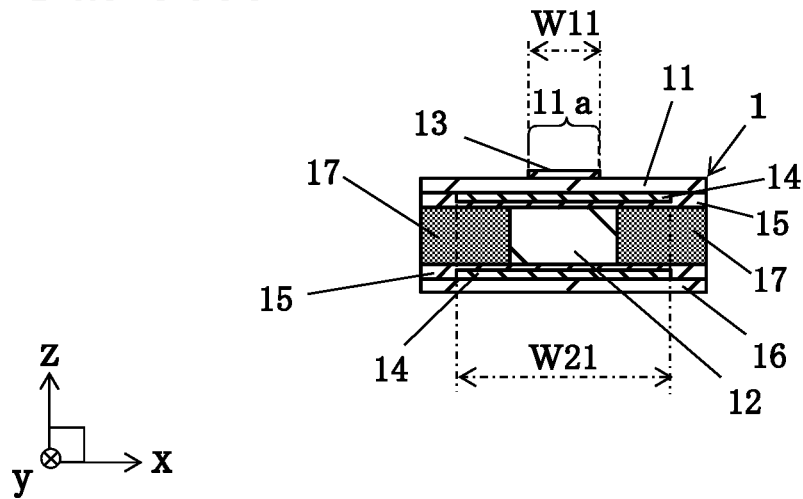
FIG. 17A is a vertical sectional view of the substrate for mounting electronic element taken along the line A-A shown in FIG. 16A.
Figure 17B:
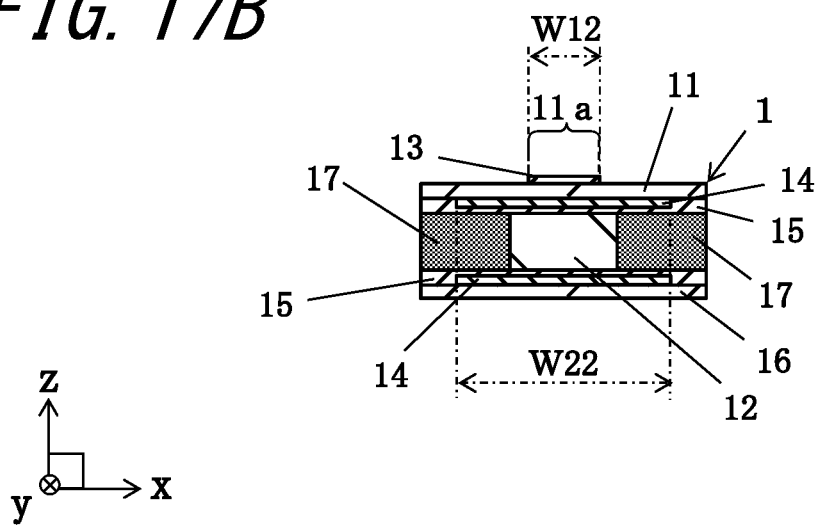
FIG. 17B is a vertical sectional view of the substrate for mounting electronic element taken along the line B-B shown in FIG. 16A.
Figure 17C:
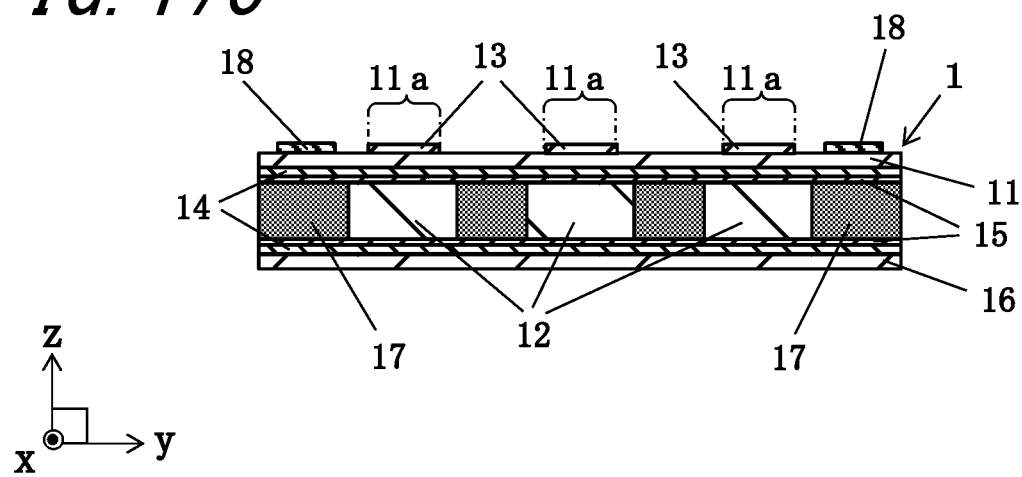
FIG. 17C is a vertical sectional view of the substrate for mounting electronic element taken along the line C-C shown in FIG. 16A.
Figure 18A:
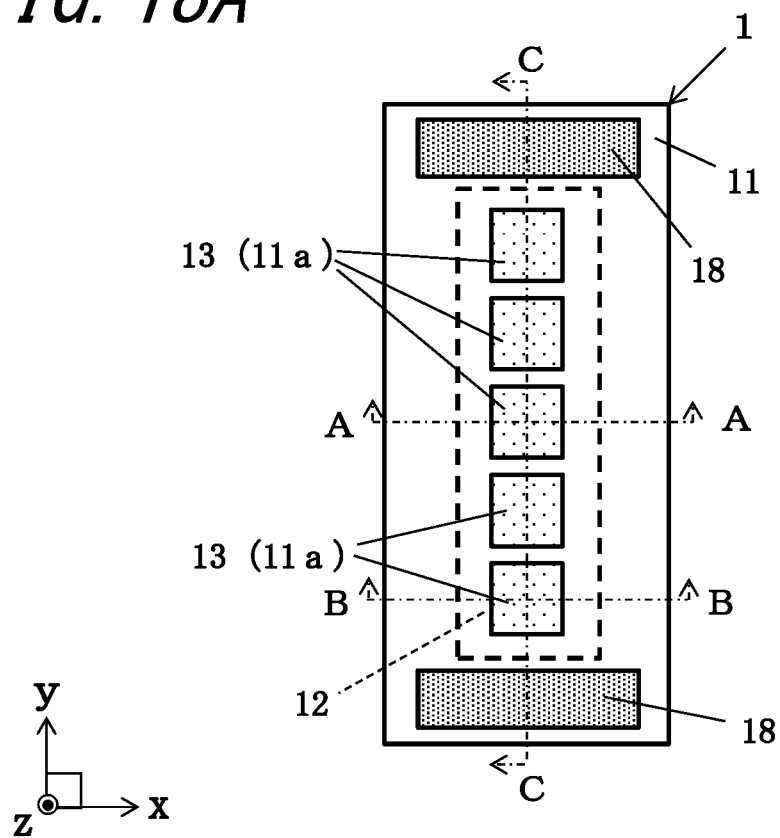
FIG. 18A is a top plan view showing another substrate for mounting electronic element according to the fourth embodiment.
Figure 18B:
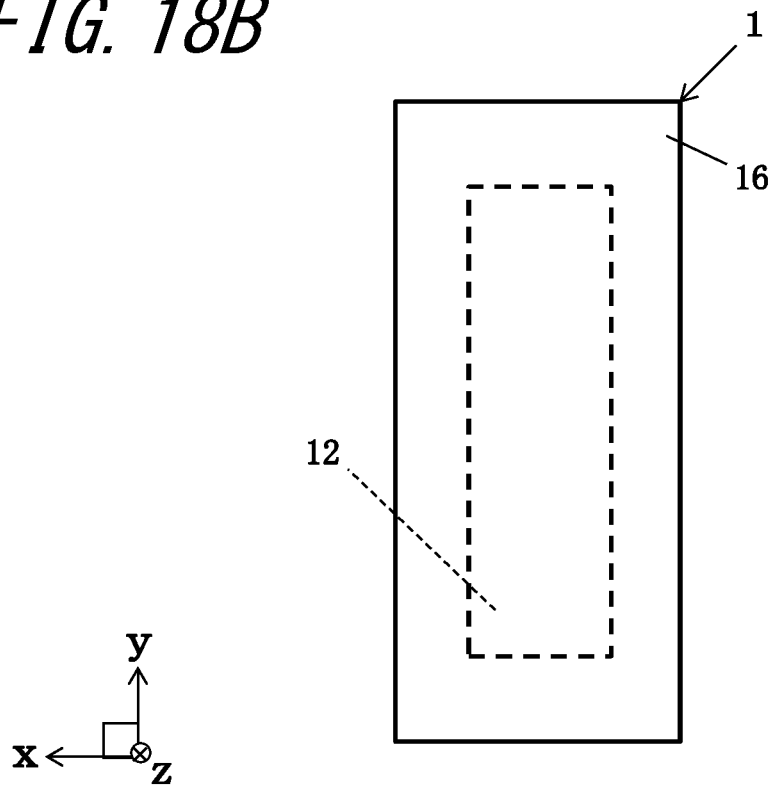
FIG. 18B is a bottom plan view of the substrate shown in FIG. 18A.
Figure 19A:
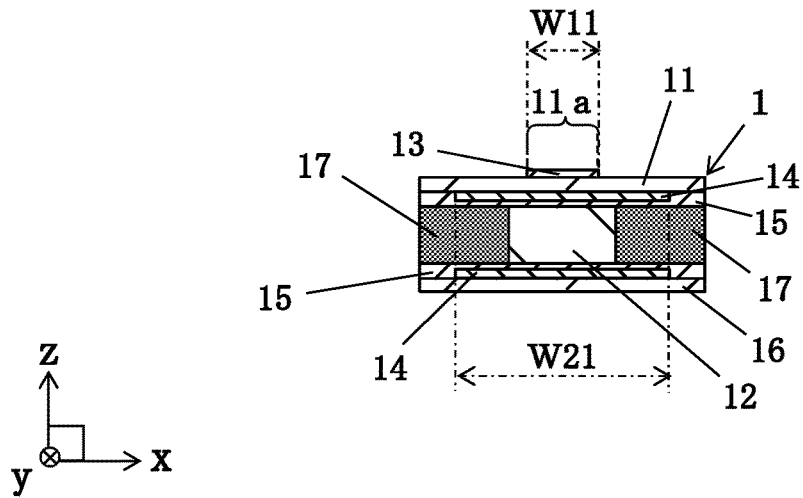
FIG. 19A is a vertical sectional view of the substrate for mounting electronic element taken along the line A-A shown in FIG. 18A.
Figure 19B:
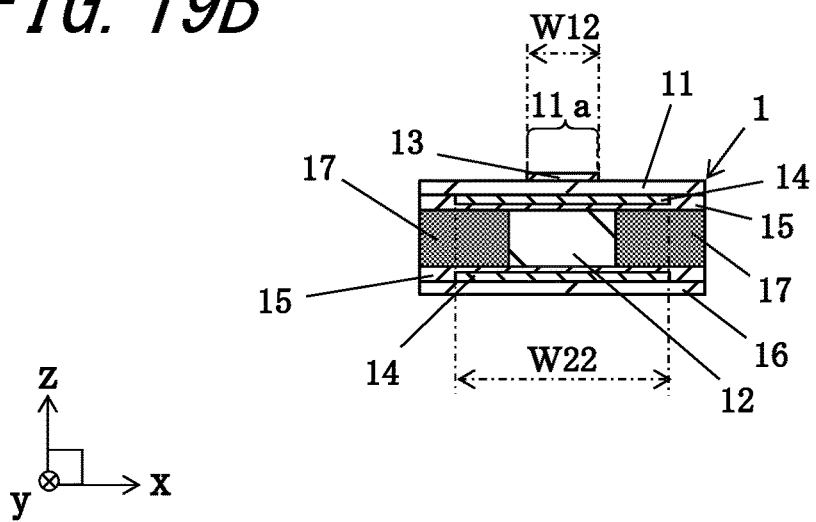
FIG. 19B is a vertical sectional view of the substrate for mounting electronic element taken along the line B-B shown in FIG. 18A.
Figure 19C:
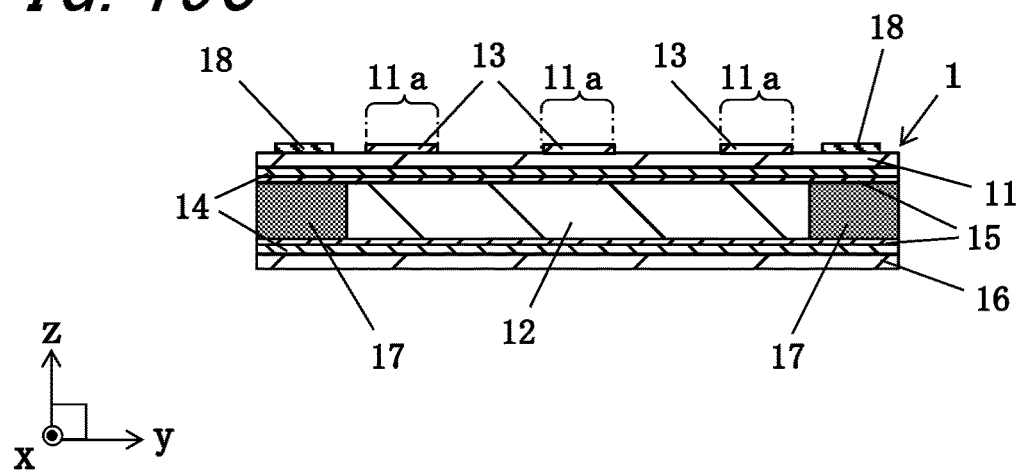
FIG. 19C is a vertical sectional view of the substrate for mounting electronic element taken along the line C-C shown in FIG. 18A.

In FIGS. 16A and 16B, the surface metal layers 13 and second surface metal layers 18 of this embodiment are each indicated by a dot-shaded area.

In the substrate for mounting electronic element 1 according to the fourth embodiment, with good bonding of a substrate area wider than the surface metal layer 13 with the bonding metal layer 14 in a direction perpendicular to the longitudinal direction in which a plurality of the mounting portions 11a are arranged, heat from the surface metal layer 13 is readily transmitted toward the second substrate 12, can be conducted in a direction perpendicular to the longitudinal direction in which the plurality of mounting portions 11a are arranged, and is satisfactorily dissipated in the arrangement of the mounting portions 11a as a whole. This makes it possible to reduce distortion of the substrate for mounting electronic element 1 and thus achieve satisfactory light emission.

The second surface metal layer 18 may be formed by using the same material and method as those used for the formation of the surface metal layer 13 as described above.

While a plurality of second substrates 12 are located so as to overlap with their respective mounting portions 11a in the example shown in FIGS. 16A to 17C, as in the example shown in FIGS. 18A to 19C, the second substrate 12 may be provided as a single second substrate 12 which overlaps with the arrangement of the plurality of mounting portions 11a. In this case, the second substrate 12 is disposed so as to conduct heat more greatly in a direction perpendicular to the longitudinal direction of the mounting portion 11a than in the longitudinal direction in which the plurality of mounting portions 11a are arranged.

Otherwise, the substrate for mounting electronic element 1 according to the fourth embodiment can be manufactured using a similar method to the method of manufacturing the substrate for mounting electronic element 1 according to the preceding embodiment.

Fifth Embodiment

The following describes an electronic device according to a fifth embodiment of the disclosure with reference to FIGS. 20A to 21B.

A substrate for mounting electronic element 1 according to the fifth embodiment differs from the substrate for mounting electronic element 1 according to the preceding embodiment in that the second principal surface of the first substrate 11 is convexly curved toward the third principal surface of the second substrate 12 as seen in a direction perpendicular to the longitudinal direction of the mounting portion 11a, in other words, as viewed in a vertical section perpendicular to the longitudinal direction of the mounting portion 11a.

Figure 20A:
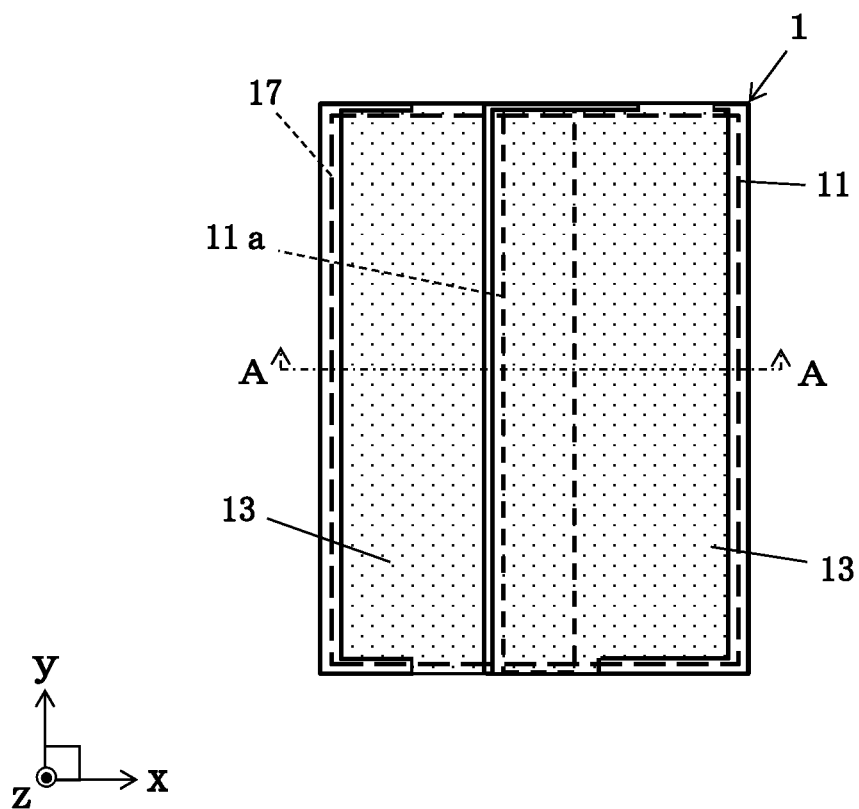
FIG. 20A is a top plan view showing a substrate for mounting electronic element according to a fifth embodiment.
Figure 20B:
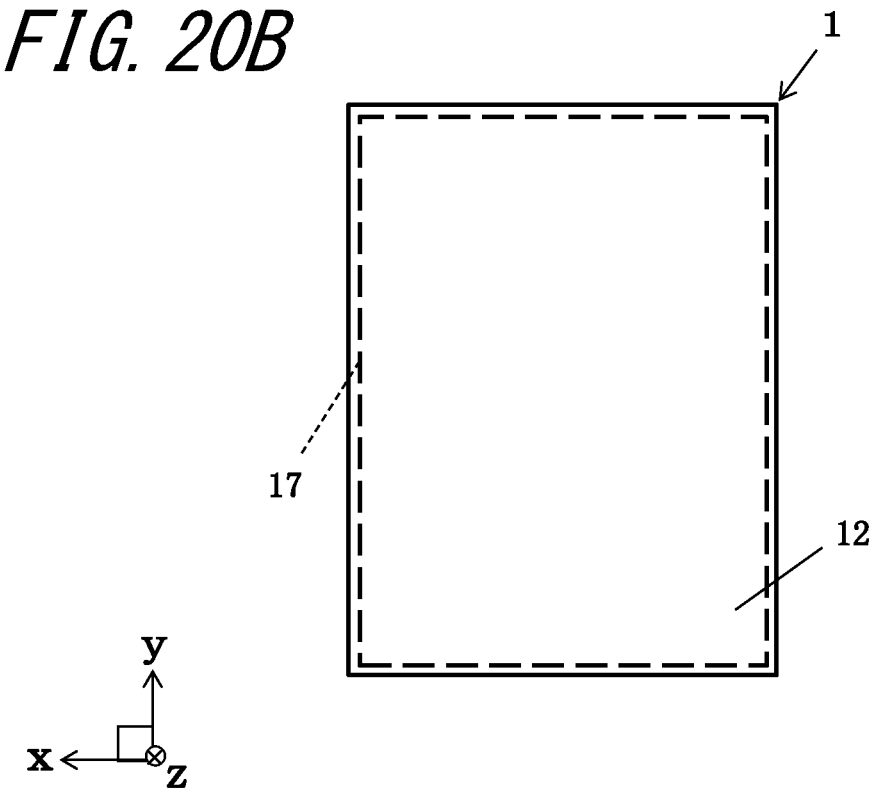
FIG. 20B is a bottom plan view of the substrate shown in FIG. 20A.

In FIGS. 20A and 20B, the surface metal layer 13 of this embodiment is indicated by a dot-shaded area.

In the substrate for mounting electronic element 1 according to the fifth embodiment, as in the substrate for mounting electronic element 1 according to the preceding embodiment, with good bonding of a substrate area wider than the surface metal layer 13 with the bonding metal layer 14 in a direction perpendicular to the longitudinal direction of the mounting portion 11a, heat from the surface metal layer 13 is readily transmitted toward the second substrate 12, can be conducted in a direction perpendicular to the longitudinal direction of the mounting portion 11a through the second substrate 12, and is satisfactorily dissipated in the entire mounting portion 11a. This makes it possible to reduce expansion of the electronic element 2 under the heat generated from the electronic element 2, restrain the electronic element 2 from becoming misaligned or reduce distortion of the substrate for mounting electronic element 1, and eventually achieve satisfactory light emission.

The second principal surface of the first substrate 11 is convexly curved toward the third principal surface of the second substrate 12 throughout in the longitudinal direction of the mounting portion 11a (y-direction as viewed in FIGS. 20A to 21B). In the case where the second principal surface of the first substrate 11 is convexly curved toward the third principal surface of the second substrate 12 throughout in the longitudinal direction of the mounting portion 11a, in the joining together of the first substrate 11 and the second substrate 12, the applied joining material 15 is thinner at the part located close to the midportion of the first substrate 11 bearing the mounting portion 11a than at the part located close to the outer periphery of the first substrate 11 in the longitudinal direction of the mounting portion 11a. This allows improved conduction of heat to the second substrate 12 through the midportion of the first substrate 11 along the entire length of the mounting portion 11a, and makes it possible to reduce expansion of the electronic element 2 under the heat generated from the electronic element 2, restrain the electronic element 2 from becoming misaligned or reduce distortion of the substrate for mounting electronic element 1, and eventually achieve satisfactory light emission.

The above-described substrate for mounting electronic element 1 can be produced as follows. The first substrate 11 is formed so that its surface which bears the bonding metal layer 14 is convexly curved, and the bonding metal layer 14 of the first substrate 11 is joined to the second substrate 12 with the joining material 15. After that, the first substrate 11 is flattened at its first principal surface by means of grinding or otherwise, and the surface metal layer 13 is placed on the first principal surface of the first substrate 11.

Moreover, the first substrate 11 is thicker at the midportion thereof than at the outer edge thereof as viewed in the vertical section perpendicular to the longitudinal direction of the mounting portion 11a. This allows improved conduction of heat to the second substrate 12 through the midportion of the first substrate 11, and makes it possible to reduce expansion of the electronic element 2 under the heat generated from the electronic element 2, restrain the electronic element 2 from becoming misaligned or reduce distortion of the substrate for mounting electronic element 1, and eventually achieve satisfactory light emission.

Moreover, if the first substrate 11 is shaped so that its thickness becomes larger gradually from the outer edge to the midportion, this allows even improved conduction of heat to the second substrate 12 through the midportion of the first substrate 11, and makes it possible to further reduce expansion of the electronic element 2 under the heat generated from the electronic element 2, restrain the electronic element 2 from becoming misaligned or reduce distortion of the substrate for mounting electronic element 1, and eventually achieve satisfactory light emission.

Figure 21A:
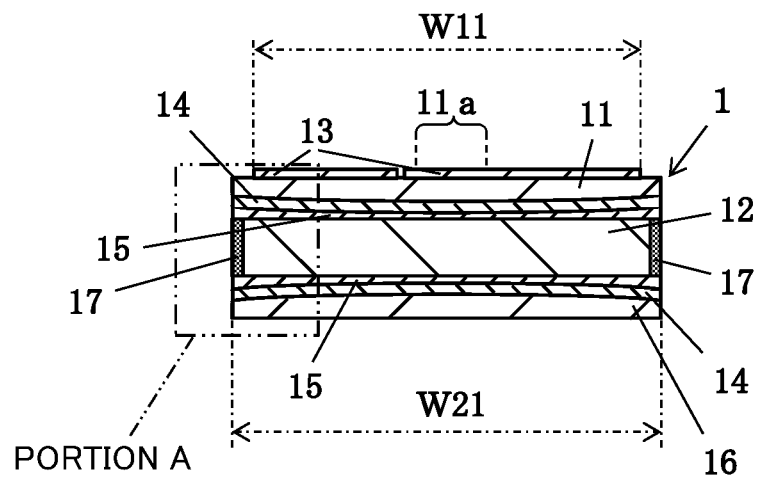
FIG. 21A is a vertical sectional view of the substrate for mounting electronic element taken along the line A-A shown in FIG. 20A.
Figure 21B:
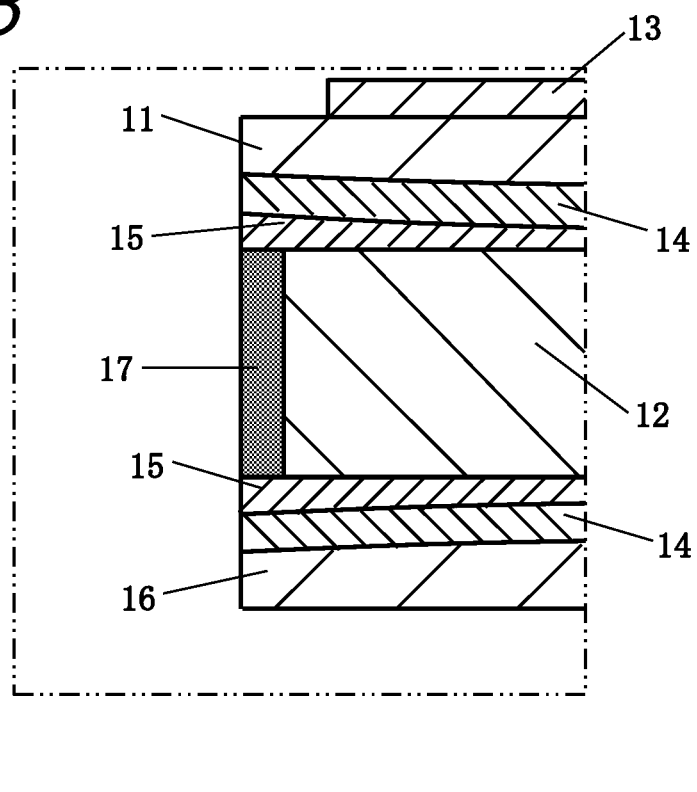
FIG. 21B is a sectional view showing in enlarged dimension main components in the portion A shown in FIG. 21A.

Moreover, as in the example shown in FIGS. 21A and 21B, in the case where the fifth principal surface of the third substrate 16 is convexly curved toward the fourth principal surface of the second substrate 12 throughout in the longitudinal direction of the mounting portion 11a, the second substrate 12 side can lie between the first substrate 11 and the third substrate 16 each convexly curved toward the second substrate 12. This makes it possible to reduce distortion of the substrate for mounting electronic element 1 resulting from the difference in thermal expansion among the first substrate 11, the second substrate 12, and the third substrate 16, restrain the electronic element 2 from becoming misaligned or reduce distortion of the substrate for mounting electronic element 1, and eventually achieve satisfactory light emission.

Moreover, the joining material 15 is located between the bonding metal layer 14 and the third principal surface, and, the joining material 15 is thicker at the outer edge thereof than at the midportion thereof as viewed in the vertical section perpendicular to the longitudinal direction of the mounting portion 11a. In this case, heat generated from the electronic element 2 can be transmitted readily not only to the midportion of the substrate for mounting electronic element 1 but also to the outer edge of the substrate for mounting electronic element 1. This makes it possible to reduce uneven heat conduction through the substrate for mounting electronic element 1, facilitate efficient transmission of heat to the second substrate 12, reduce expansion of the electronic element 2 under the heat generated from the electronic element 2, restrain the electronic element 2 from becoming misaligned or reduce distortion of the substrate for mounting electronic element 1, and eventually achieve satisfactory light emission.

Moreover, preferably the joining material 15 is shaped so that its thickness becomes larger gradually from the center thereof to the outer edge thereof as viewed in the vertical section perpendicular to the longitudinal direction of the mounting portion 11a. In this case, heat generated from the electronic element 2 can be transmitted readily not only to the midportion of the substrate for mounting electronic element 1 but also to the outer edge of the substrate for mounting electronic element 1. This makes it possible to reduce uneven heat conduction through the substrate for mounting electronic element 1, facilitate efficient transmission of heat to the second substrate 12, reduce expansion of the electronic element 2 under the heat generated from the electronic element 2, restrain the electronic element 2 from becoming misaligned or reduce distortion of the substrate for mounting electronic element 1, and eventually achieve satisfactory light emission.

Moreover, if the second substrate 12 is provided externally with the fourth substrate 17, and the fourth substrate 17 is located at the thicker portion of the joining material 15, as viewed in the vertical section perpendicular to the longitudinal direction of the mounting portion 11a, this makes it possible to reduce excessive transmission of heat generated from the electronic element 2 to the outer edge of the substrate for mounting electronic element 1, reduce uneven heat conduction through the substrate for mounting electronic element 1 effectively, facilitate efficient transmission of heat to the second substrate 12, reduce expansion of the electronic element 2 under the heat generated from the electronic element 2, restrain the electronic element 2 from becoming misaligned or reduce distortion of the substrate for mounting electronic element 1, and eventually achieve satisfactory light emission.

Moreover, if, as viewed in the vertical section perpendicular to the longitudinal direction of the mounting portion 11a, the fourth substrate 17 is located at the thicker portion of the joining material 15, this makes it possible to reduce excessive transmission of heat generated from the electronic element 2 to the outer edge of the substrate for mounting electronic element 1, reduce uneven heat conduction through the substrate for mounting electronic element 1 effectively, facilitate efficient transmission of heat to the second substrate 12, reduce expansion of the electronic element 2 under the heat generated from the electronic element 2, restrain the electronic element 2 from becoming misaligned or reduce distortion of the substrate for mounting electronic element 1, and eventually achieve satisfactory light emission.

Moreover, if, as viewed in the vertical section perpendicular to the longitudinal direction of the mounting portion 11a, the fourth substrate 17 is located in correspondence with the thinner portion of the first substrate 11, this makes it possible to reduce excessive transmission of heat generated from the electronic element 2 to the outer edge of the substrate for mounting electronic element 1, reduce uneven heat conduction through the substrate for mounting electronic element 1 effectively, facilitate efficient transmission of heat to the second substrate 12, reduce expansion of the electronic element 2 under the heat generated from the electronic element 2, restrain the electronic element 2 from becoming misaligned or reduce distortion of the substrate for mounting electronic element 1, and eventually achieve satisfactory light emission.

In a similar way to the foregoing procedure, the above-described substrate for mounting electronic element 1 can be produced by successively following the step of forming the third substrate 16 so that its surface which bears the bonding metal layer 14 is convexly curved, the step of joining the second substrate 12 with the bonding metal layer 14 of the third substrate 16 via the joining material 15, and the step of flattening the six principal surface side of the third substrate 16 by means of grinding or otherwise.

Alternatively the substrate for mounting electronic element 1 can be produced by successively following the step of placing the convexly curved first substrate 11 on the third principal surface side of the second substrate 12, the step of placing the convexly curved third substrate 16 on the fourth principal surface side of the second substrate 12, and the step of joining the first substrate 11, the second substrate 12, and the third substrate 16 together with the joining materials 5 at one time.

Moreover, the third substrate 16 may be structurally similar to the above-described first substrate 11. Moreover, the bonding metal layer 14 and the joining material 15 located close to the third substrate 16 may be structurally similar to the bonding metal layer 14 and the joining material 15 located close to the above-described first substrate 11, respectively. Moreover, the positional relationship between the fourth substrate 17 and the third substrate 16-side joining material 15 may be similar to that between the fourth substrate 17 and the first substrate 11-side joining material 15. Likewise, the positional relationship between the fourth substrate 17 and the third substrate 16 may be similar to that between the fourth substrate 17 and the first substrate 11.

Otherwise, the substrate for mounting electronic element 1 according to the fifth embodiment can be manufactured using a similar method to the method of manufacturing the substrate for mounting electronic element 1 according to the preceding embodiment.

The disclosure is not limited to the embodiments described heretofore, and thus various changes and modifications may be made therein. For example, each of the substrates for mounting electronic element 1 according to the first to fifth embodiments may be in the form of a quadrangular composite substrate having beveled or chamfered corners.

Moreover, like the substrate for mounting electronic element 1 according to the fifth embodiment, the substrate for mounting electronic element 1 according to the fourth embodiment may be configured so that the second principal surface of the first substrate 11 is convexly curved toward the third principal surface of the second substrate 12 throughout in the longitudinal direction in which a plurality of the mounting portions 11a are arranged (x-direction as viewed in FIGS. 17A to 18B).

The invention claimed is:

1. A substrate for mounting an electronic element, comprising:
    a first substrate comprising a first surface and a second surface opposed to the first surface, the first substrate being made of an insulating material;
    a second substrate comprising a third surface and a fourth surface opposed to the third surface, the second substrate being made of a carbon material;
    at least one surface metal layer located on the first surface, the at least one surface metal layer comprising at least one mounting portion for at least the one electronic element; and
    a bonding metal layer comprising a thin film layer and a plating layer having a combined thickness of 9.5 µm or less located on the second surface,
    in a transparent plan view of the substrate for mounting the electronic element, the at least one mounting portion being rectangular in shape,
    the third surface being connected to at least the second surface via the bonding metal layer at position overlapped with the at least one mounting portion in the transparent plan view of the substrate for mounting the electronic element,
    heat conduction of the second substrate in a direction perpendicular to a longitudinal direction of the at least one mounting portion being greater than heat conduction of the second substrate in the longitudinal direction of the at least one mounting portion,
    a width of the bonding metal layer being greater than or equal to a maximum width of the at least one surface metal layer in a direction perpendicular to the longitudinal direction of the at least one mounting portion,
    wherein the thin film layer comprises a metallic adherent layer and a barrier layer.

2. The substrate for mounting the electronic element according to claim 1,
wherein as viewed in a vertical section perpendicular to the longitudinal direction of the at least one mounting portion, the second surface is convexly curved toward the third surface.

3. The substrate for mounting the electronic element according to claim 2,
wherein as viewed in the vertical section perpendicular to the longitudinal direction of the at least one mounting portion, the first substrate is thicker at a midportion thereof than at an outer edge thereof.

4. The substrate for mounting the electronic element according to claim 3,
wherein a joining material is located between the bonding metal layer and the third surface, and
as viewed in the vertical section perpendicular to the longitudinal direction of the at least one mounting portion, the joining material is thicker at an outer edge thereof than at a midportion thereof.

5. The substrate for mounting the electronic element according to claim 2,
wherein a joining material is located between the bonding metal layer and the third surface, and
as viewed in the vertical section perpendicular to the longitudinal direction of the at least one mounting portion, the joining material is thicker at an outer edge thereof than at a midportion thereof.

6. An electronic device, comprising:
the substrate for mounting the electronic element according to claim 1;
the at least one electronic element mounted on the at least one mounting portion of the substrate, and
a wiring substrate or a package for housing the electronic element on which the substrate for mounting the electronic element is mounted.

7. An electronic module, comprising:
the electronic device according to claim 6; and
a module substrate to which the electronic device is connected.

8. The substrate for mounting the electronic element according to claim 1,
wherein as viewed in a vertical section perpendicular to the longitudinal direction of the at least one mounting portion, the second surface is convexly curved toward the third surface.

9. The substrate for mounting the electronic element according to claim 8,
wherein as viewed in the vertical section perpendicular to the longitudinal direction of the at least one mounting portion, the first substrate is thicker at a midportion thereof than at an outer edge thereof.

10. The substrate for mounting the electronic element according to claim 8,
wherein a joining material is located between the bonding metal layer and the third surface, and
as viewed in the vertical section perpendicular to the longitudinal direction of the at least one mounting portion, the joining material is thicker at an outer edge thereof than at a midportion thereof.

11. The substrate for mounting the electronic element according to claim 9,
wherein a joining material is located between the bonding metal layer and the third surface, and
as viewed in the vertical section perpendicular to the longitudinal direction of the at least one mounting portion, the joining material is thicker at an outer edge thereof than at a midportion thereof.

* * * * *